(12) United States Patent
Beck et al.

(10) Patent No.: US 7,144,683 B2
(45) Date of Patent: Dec. 5, 2006

(54) PHOTOPATTERNABLE MOLECULAR CIRCUITRY

(75) Inventors: Patricia A. Beck, Palo Alto, CA (US); Xiao-An Zhang, Sunnyvale, CA (US); Zhang-Lin Zhou, Mtn. View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 136 days.

(21) Appl. No.: 10/697,144

(22) Filed: Oct. 30, 2003

(65) Prior Publication Data

US 2004/0122233 A1 Jun. 24, 2004

Related U.S. Application Data

(62) Division of application No. 10/001,756, filed on Oct. 24, 2001.

(51) Int. Cl.
*G03F 7/00* (2006.01)

(52) U.S. Cl. .................... 430/311; 430/270.1

(58) Field of Classification Search .......... 430/311, 430/270.1
See application file for complete search history.

(56) References Cited

U.S. PATENT DOCUMENTS

| | | | | |
|---|---|---|---|---|
| 4,282,354 A | * | 8/1981 | Van Allan et al. | 549/43 |
| 5,475,341 A | * | 12/1995 | Reed | 327/566 |
| 5,587,509 A | * | 12/1996 | Hess et al. | 560/130 |
| 5,589,692 A | * | 12/1996 | Reed | 257/23 |
| 5,998,580 A | * | 12/1999 | Fay et al. | 530/333 |
| 6,320,200 B1 | * | 11/2001 | Reed et al. | 257/40 |
| 6,512,119 B1 | * | 1/2003 | Bratkovski et al. | 546/104 |
| 6,979,639 B1 | * | 12/2005 | Heath et al. | 438/622 |
| 2002/0075557 A1 | * | 6/2002 | Zhang et al. | 359/321 |
| 2002/0114557 A1 | * | 8/2002 | Zhang et al. | 385/17 |
| 2002/0176276 A1 | * | 11/2002 | Zhang et al. | 365/151 |
| 2004/0066677 A1 | * | 4/2004 | Zhang et al. | 365/200 |
| 2004/0122233 A1 | * | 6/2004 | Beck et al. | 546/104 |
| 2004/0227605 A1 | * | 11/2004 | Zhang et al. | 335/296 |

* cited by examiner

*Primary Examiner*—John S. Chu

(57) ABSTRACT

Bistable molecules are provided with at least one photosensitive functional group. As thus constituted, the bistable molecules are photopatternable, thereby allowing fabrication of micrometer-scale and nanometer-scale circuits in discrete areas without relying on a top conductor as a mask. The bistable molecules may comprise molecules that undergo redox reactions, such as rotaxanes and catenanes, or may comprise molecules that undergo an electric-field-induced band gap change that causes the molecules, or a portion thereof, to rotate, bend, twist, or otherwise change from a substantially fully conjugated state to a less conjugated state. The change in states in the latter case results in a change in electrical conductivity.

15 Claims, 7 Drawing Sheets

PHOTOPATTERNABLE MOLECULAR CIRCUITRY

CROSS-REFERENCES TO RELATED APPLICATIONS

This application is a divisional of prior application Ser. No: 10/001,756 filed Oct. 24, 2001.

TECHNICAL FIELD

The present invention relates generally to methods of making electronic circuitry, and, more particularly, to forming the elements of the electronic circuitry directly, without the need for separate photoresist steps.

BACKGROUND ART

Photoresist masks for patterning layers to fabricate electronic circuits are well-known. That technology is the basis for today's microcircuits. Briefly, positive or negative polymeric resists are used, involving the formation of a layer of resist on a surface, exposing the resist to radiation (visible, UV, X-ray, etc.) through a mask to cross-link (or unlink) portions of the resist, followed by removal of unwanted portions of the resist. The resist then serves as a mask for further processing steps, such as ion implantation, oxidation, metallization, and the like.

The area of molecular electronics is in its infancy. Developments in nanotechnology (critical dimension measured in nanometers) are directed to new generations of electronic circuitry, having much smaller dimensions than present technology can provide.

While a number of different approaches have been developed, one that is of current interest involves self-assembled wires, with at least one connector species between connecting pairs of wires to form a junction. The connector species comprises a bistable molecular switch. Such switches can be configured as, for example, crossbar memories and logic circuits. The investigations are reported, for example, by C. P. Collier et al., *Science*, Vol. 285, pp.391–394 (16 Jul. 1999) and C. P. Collier et al., *Science*, Vol. 289, pp. 1172–1175 (18 Aug. 2000); see also U.S. Pat. No. 6,128,214, entitled "Molecular Wire Crossbar Memory", issued Oct. 3, 2000, to P. J. Kuekes et al and U.S. Pat. No. 6,256,767, entitled "Demultiplexer for a Molecular Wire Crossbar Network (MWCN DEMUX)", issued to P. J. Kuekes et al on Jul. 3, 2001.

The references in the foregoing paragraph deal with oxidation/reduction ("redox") reactions involving, for example, rotaxanes, pseudo-rotaxanes, catenanes, and spiropyrans as the connector species. More recent work has shown that the connector species may comprise molecules that evidence an electric-field induced band gap change as a consequence of some mechanical action; see, e.g., application Ser. No. 09/823,195, filed Mar. 29, 2001, entitled "Bistable Molecular Mechanical Devices with a Band Gap Change Activated by an Electric Field for Electronic Switching, Gating, and Memory Applications", and assigned to the same assignee as the present application. The molecular system employed as the connector species has an electric-field induced band gap change, and thus a change in its electrical conductivity, that occurs via one of the following mechanisms: (1) molecular conformation change (e.g., rotation of a part of the molecule with respect to another part of the molecule); (2) change of extended conjugation via chemical bonding change to alter the band gap (e.g., charge separation or recombination of the molecule); or (3) molecular folding or stretching. Nano-meter-scale reversible electronic switches are thus provided that can be assembled easily to make cross-bar circuits, which provide memory, logic, and communication functions.

The patterning of nano-scale circuits with conventional photoresists presents a daunting task, and requires novel methods: Making and using resist by conventional means (especially in direct contact with the molecule, or connector species) could adversely alter the properties of the ultra-thin junction. Further, barrier materials between the molecule and the conventional resist could adversely alter the properties of the junction itself; for example, many metallic species could diffuse into or bind tightly with the molecule, becoming essentially unremovable/inseparable.

Polymer electronics on this thickness scale (nanometers) presents special problems (rotaxane studies by Collier et al, supra, are on the order of 100 Å or less). The present invention sidesteps the use of imprinting techniques and makes intermediate mask transfer unnecessary. The present invention is useful in both micrometer-scale and nanometer-scale devices.

DISCLOSURE OF INVENTION

In accordance with the present invention, bistable molecules are provided with at least one photosensitive (ultraviolet, electron-beam, or X-ray) functional group. As thus constituted, the bistable molecules are photo-patternable, thereby allowing fabrication of circuits. The bistable molecules may comprise molecules that undergo redox reactions, such as rotaxanes and catenanes, or, more preferably, may comprise molecules that undergo an electric-field induced band gap change that causes the molecules, or a portion thereof, to rotate, bend, twist, or otherwise change from a substantially fully conjugated state to a less conjugated state. The change in states in the latter case results in a change in electrical conductivity.

Specifically, a bistable molecule for a multiple electrode device comprises at least one pair of electrodes that form at least one junction and at least one connector species connecting the pair of electrodes in the junction, where the junction has a functional dimension in nanometers or micrometers. The connector species comprises the bistable molecule provided with at least one photosensitive functional group for patterning the connector species.

Also in accordance with the present invention, a method is provided for fabricating the multiple electrode device. The method comprises:

(a) forming a first set of the electrodes on a substrate;

(b) depositing a film of the bistable molecule, including the photosensitive group, on the electrodes;

(c) exposing portions of the bistable molecular film to irradiation (ultraviolet, electron-beam, or X-ray); and (d) removing unwanted portions of the bistable molecular film to provide a photo-patterned molecular film.

A second set of the electrodes may be deposited adjacent the first set of the electrodes, either above (at a non-zero angle thereto) or in the same plane as the first set of electrodes. Alternatively, the second set of electrodes may be eliminated if the resulting device is probe-tip addressable.

Multiple sheets of molecules may be employed in the practice of the present invention. Alternatively, multiple discrete islands of different molecules may be employed.

An advantage of the present invention over the prior art is that the top electrode (the second set of electrodes) does not define the junction. Rather, the molecular area is defined independently, due to the use of the photosensitive group.

The present invention provides a class of bistable molecular switches with at least one photosensitive functional group on the molecule. Those molecules can serve as both a molecular device and photoresist-type mask for patterning a layer to fabricate molecular circuits. This will simplify the traditional process and shorten the time to produce a batch of circuits, leading to inexpensive products, such as electronic memory (write once or rewriteable), electronically addressable displays, and generally any circuit for which organic electronics or opto-electronics will be acceptable.

Advantageously, the present invention reduces or eliminates conventional photoresist masking layers, and simplifies the fabrication of micro-scale and nano-scale circuits.

BEST MODES FOR CARRYING OUT THE INVENTION

Definitions

Figure 1:
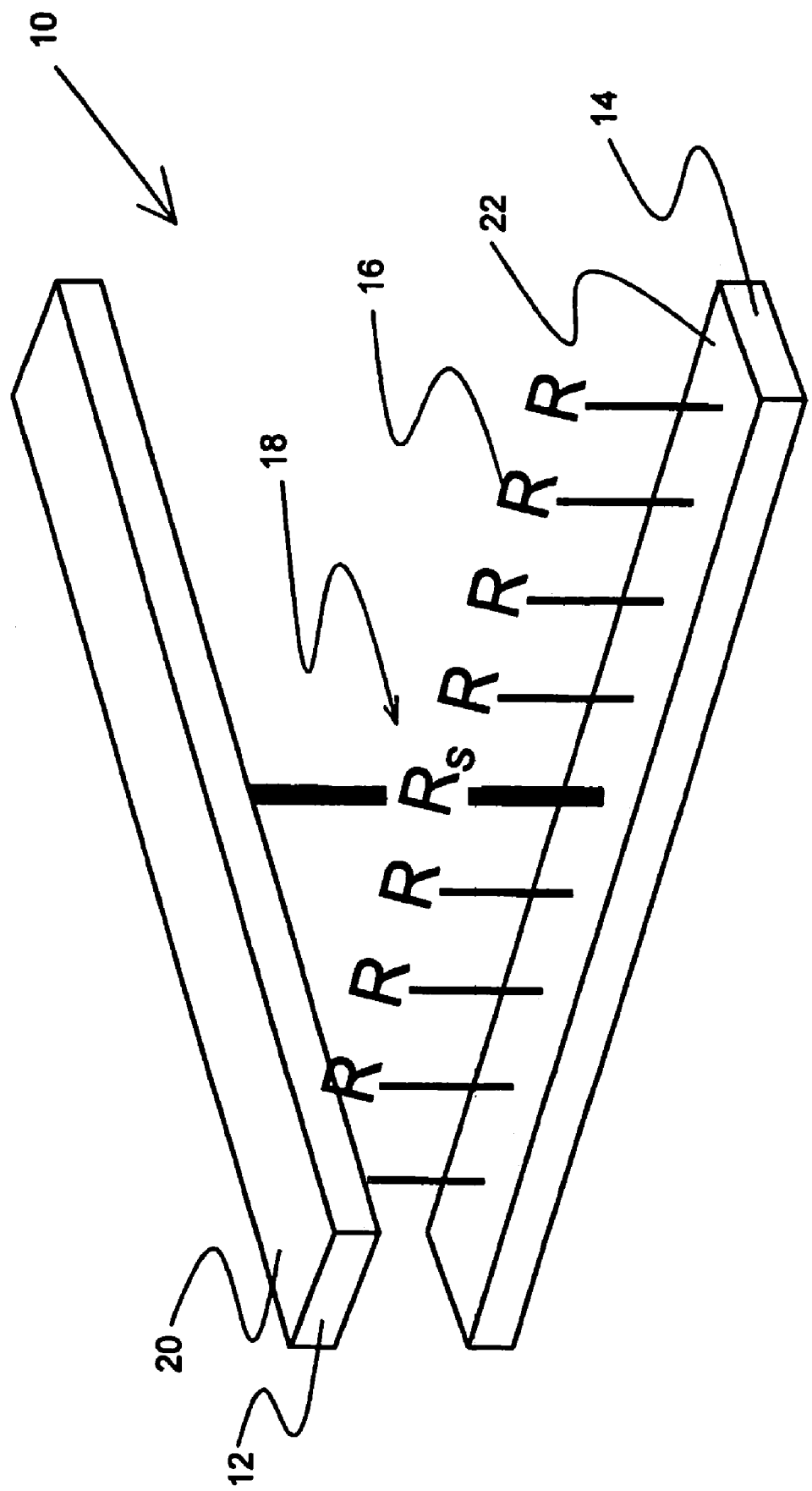
FIG. 1 is a perspective elevational view, schematically depicting two crossed wires, with at least one molecule at the intersection of the two wires.

As used herein, the term "self-aligned" as applied to "junction" means that the junction that forms the switch and/or other electrical connection between two wires is created wherever two wires, either of which may be coated, cross each other, because it is the act of crossing that creates the junction. The junction in its critical dimensions may be measured in nanometers or micrometers.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bistable" as applied to a molecule means a molecule having two relatively low energy states. The molecule may be either irreversibly switched from one state to the other (singly configurable) or reversibly switched from one state to the other (reconfigurable).

The term "micron-scale dimensions" refers to dimensions that range from 1 micrometer to a few micrometers in size.

The term "sub-micron scale dimensions" refers to dimensions that range from 1 micrometer down to 0.04 micrometers.

The term "nanometer scale dimensions" refers to dimensions that range from 0.1 nanometers to 50 nanometers (0.05 micrometers).

The terms "micron-scale wires" and "submicron-scale wires" generally refer to rod or ribbon-shaped conductors or semiconductors with widths or diameters having the dimensions of 0.1 to several micrometers, and heights that can range from a few tens of nanometers to several micrometers.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules.

Crossed Wire Switch

There are many possible configurations for fabricating nanometer-scale and micrometer-scale devices. One such approach employs crossed-wire switches. Another approach involves probe-addressable devices. The present invention is not limited to the particular configuration of the device, but rather is directed to photopatterning the molecular species employed in the device. Because the field of molecular electronics is still relatively new, a crossed-wire switch is described below.

The essential device features are disclosed in co-pending patent application Ser. No. 09/280,048, filed Mar. 29, 1999, incorporated herein by reference and shown in FIGS. 1a–1b. A crossed wire switch 10 comprises two wires 12, 14, each either a metal or semiconductor wire, that are crossed at some non-zero angle. In between those wires is a layer of molecules or molecular compounds 16, denoted R in FIGS. 1a and 1b. The particular molecules 18 (denoted $R_s$) that are sandwiched at the intersection of the two wires 12, 14 are identified as switch molecules and exist at a junction defined by the two wires. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would have a molecule undergo reduction, and then a second molecule (the other half of the redox pair) would be oxidized. In another example, a molecule is reduced, and one of the wires is oxidized. In a third example, a molecule is oxidized, and one of the wires is reduced. In a fourth example, one wire is oxidized, and an oxide associated with the other wire is reduced. See also U.S. Pat. No. 6,128,214, entitled "Molecular Wire Crossbar Memory", issued to P. J. Kuekes et al on Oct. 3, 2000, and U.S. Pat. No. 6,256,767, entitled "Demultiplexer for a Molecular Wire Crossbar Network (MWCN DEMUX)", issued to P. J. Kuekes et al on Jul. 3, 2001, both of which are incorporated herein by reference.

Depending on the molecules or materials that are used between the wires (the electrodes), each junction can either display the types of electrical function described below immediately on contact of the wires or the junction can have a switching function that acts to connect or disconnect the two wires together electrically. This switch can be either singly configurable or reconfigurable. In the first case, the initial state of the switch is open or closed. Electrically biasing the switch beyond a particular threshold voltage that is determined by the materials in the junction, which is essentially an electrochemical cell, oxidizes or reduces the material or molecules between the wires to irreversibly close or open the switch, respectively, thus permanently reversing its initial state. In the second case, by cycling the polarity and magnitude of the voltage on the switch beyond the appropriate threshold values, it is possible to reversibly oxidize or reduce the properly selected materials or molecules to close or open the switch many times. In either case, when closed, the type of electrical connection that is made between the wires depends upon the materials from which the wires (or electrodes) are fabricated as well as the identity of the molecules or materials between the wires.

Further, FIG. 1 depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$, or junction, 18 is formed.

Different functions can be obtained from various combinations of electrode materials and materials or molecules used in the junction. For example, a resistor has a linear current-voltage characteristic, and is made by intentionally over-reducing the junction between various types of wires to essentially form a short circuit between the wires. The opposite of this process is to over-oxidize a junction, which will consume the wire in a localized region and effectively break the wire (acting as a fuse and creating an open circuit) in that wire at the position of the junction. A tunneling resistor maintains a thin, insulating barrier (approximately 2 nm thick) between wires and has an exponential current-voltage characteristic. In the case where junction molecules or materials have a sharply defined energy state which lies inside the band gap of an electrically insulating barrier that can be accessed by electrically biasing the junction, the connection between the wires can exhibit a flow of electrical current that is dominated by the process of resonant tunneling. The resonant tunneling can produce one or more inflection points in the otherwise exponential current-voltage characteristic of a tunneling resistor.

A diode is a junction that passes current more easily in one direction than in the other, and thus has an asymmetry in the current-voltage characteristic for positive and negative voltages. A tunneling diode has both the positive-negative voltage asymmetry of the diode and the exponential current-voltage characteristic of the tunneling resistor. A resonant tunneling diode has a positive-negative voltage asymmetry as well as a peak in its current-voltage characteristic, such that over a restricted range of increasing voltage magnitude the current magnitude actually decreases, a phenomenon that is known as negative differential resistivity.

Finally, a battery is a circuit element that acts to hold a constant voltage difference between its electrodes as long as the battery is sufficiently charged, e.g., there is a sufficient supply of oxidizing and reducing agents separated by an insulating barrier. Charging the battery is accomplished by placing the appropriate voltage across the junction, which as stated before is an electrochemical cell, to only partially oxidize or reduce the material or molecules in the junction.

In general, any real junction between wires formed by the processes described above will actually have two or more of the electrical functions described, with the effective circuit elements connected in series. Additionally, capacitors may be formed.

Thus, any number of metallic or semiconducting wire/molecule combinations can be employed to provide useful devices, depending on the device properties desired from the assembled circuit. As described above, probe-tip addressable devices are also benefited in accordance with the teachings herein.

Fabrication of Wire Electrodes

The above-identified co-pending application Ser. No. 09/280,048 describes a number of processes to produce discrete crossed wire pairs, such as shown in FIG. 1. Also disclosed therein is a process for preparing devices made from redox pairs of micrometer-scale wires.

Molecular switching components may come from any number of different classes of molecules, depending, again, on the desired properties of the device.

The key requirement of the molecules is that, when they are sandwiched between two electrodes, they may be electrochemically modified (i.e., oxidized or reduced) by applying a voltage between the electrodes. When the molecular components are so modified, the net effect is that a barrier, e.g., a tunneling barrier, between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other.

In the foregoing embodiment, the connector species 16 may comprise a material that displays a significant, or measurable, hysteresis in its current-voltage curve, obtained from current-voltage characteristics in a solid-state junction. Examples of such species include metalocenes, rotaxanes, pseudo-rotaxanes, catenanes, and spiropyrans.

In another, more preferred, embodiment, the connector species may comprise a material that evidences switching based on electric (E) field induced band gap changes that have been discovered. These materials are the subject of a patent application, Ser. No. 09/823,195, filed on Mar. 29, 2001, entitled "Bistable Molecular Mechanical Devices with a Band Gap Change Activated by an Electric Field for Electronic Switching, Gating, and Memory Applications", by Xiao-An Zhang et al. and assigned to the same assignee as the present application. Three primary mechanisms are disclosed and claimed; one of the mechanisms has two different approaches. The mechanisms are:

(1) Electric field ("E-field") induced rotation of at least one rotatable section (rotor) of a molecule to change the band gap of the molecule (rotor/stator configuration);

(2) E-field induced charge separation or recombination of the molecule via chemical bonding change to change the band gap:

(2a) E-field-induced band gap change caused by the change of extended conjugation via charge separation or recombination accompanied by increasing or decreasing $\pi$- and/or p-electron localization;

(2b) E-field-induced band gap change caused by change of extended conjugation via charge separation or recombination and π-bond breaking or formation; and (3) E-field induced band gap change via molecular folding or stretching.

Figure 2A:
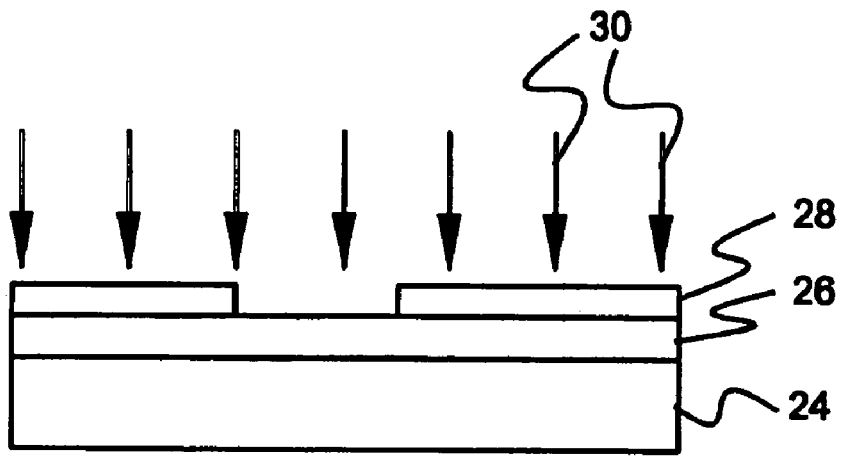
FIGS. 2a–2f provide a schematic representation of the prior art steps that use lithographically deposited (micrometer or sub-micrometer scale diameter) wires.
Figure 2B:
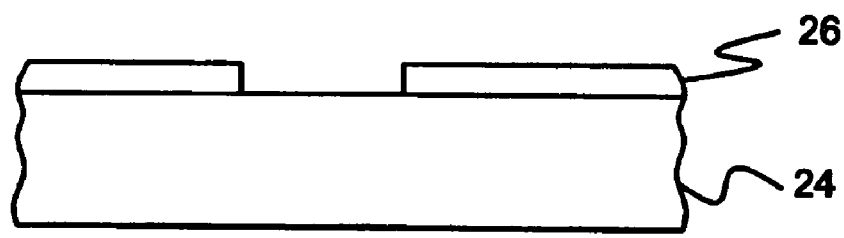
Figure 2C:
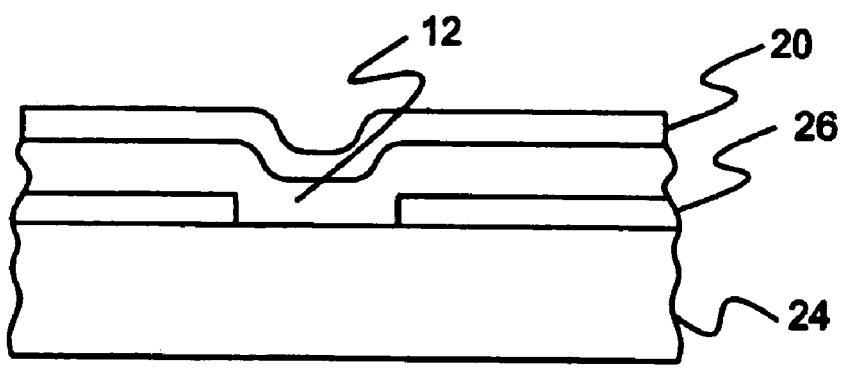
Figure 2D:
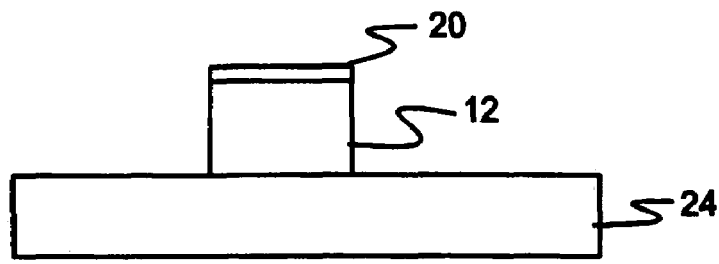
Figure 2E:
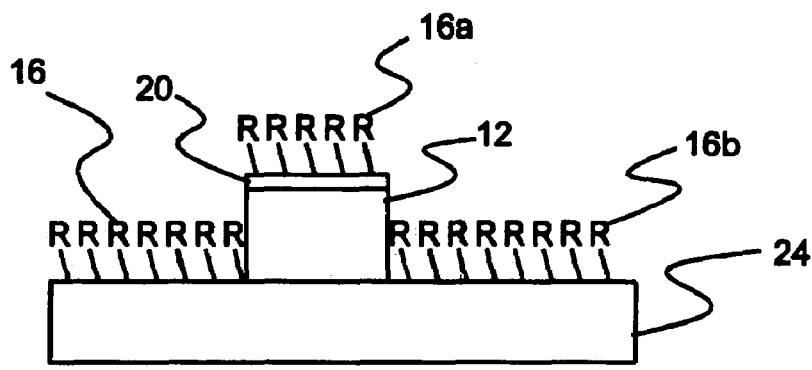
Figure 2F:
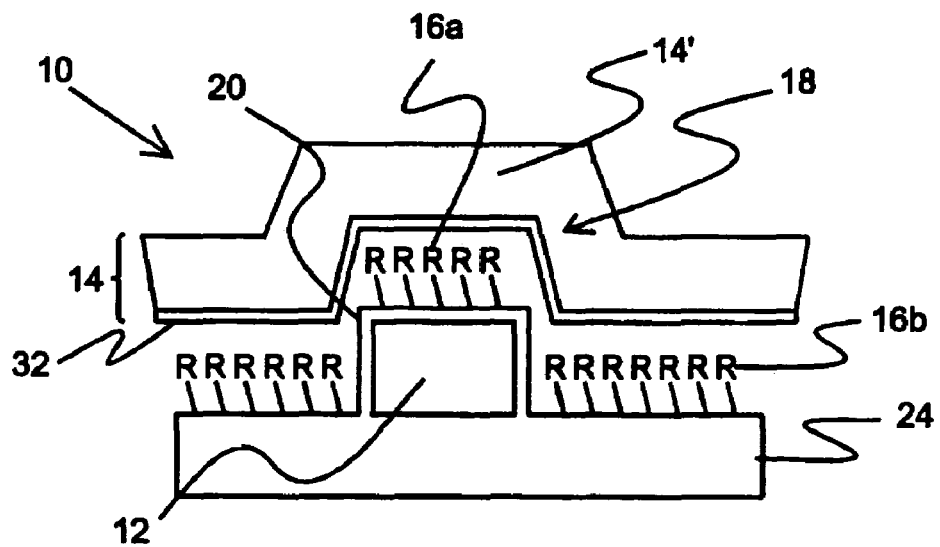

The above-mentioned co-pending patent application Ser. No. 09/280,048 discloses, inter alia, the preparation of micrometer-scale wires by shadow masking. Devices made from redox pairs could be prepared according to the method depicted in FIGS. 2a–2f. An insulating substrate 24 ($SiO_2$, for example) is coated with a photosensitive resist 26 and then covered with a photomask 28 and exposed to light 30, as illustrated in FIG. 2a. The exposed pattern is developed, a resist pattern is formed (FIG. 2b) and a metal layer 12 (Al, for example) is deposited onto the substrate 24 (FIG. 2c). A thin (1 to 2 nm) insulating layer 20 ($Al_2O_3$) is formed on the Al surface—in this case by simple exposure of the patterned substrate to air, as shown in FIG. 2c. Lift-off is used to form the metallic wire structure shown in FIG. 2d. Next, a redox pair 16, labeled R in the Figure, is deposited either by chemically selective deposition onto the $Al_2O_3$, as a Langmuir film over the entire substrate, or by sublimation of the molecules onto the entire substrate. In the latter case, redox pairs exist both on 16a and off 16b the deposited wire 12 and its insulating layer 20, as shown in FIG. 2e. Next, a second wire 14 is deposited perpendicular to the first wire 12 through a shadow mask, as shown in FIG. 2f. The second wire 14 may be comprised of one or more layers (the wire itself or a layer 32, Ti or Cr, for example) which will form an interface with the deposited molecules, followed by the thicker wire 14' deposited on top of the buffer layer, or it may just consist of wire 14. Only where the two wires 12, 14 cross (junction 18) is a device 10 defined, since an application of a voltage across the two wires is necessary to address the device. Thus, as long as the two wires 12, 14 intersect, no further alignment of the two lithographic steps is necessary in order to make a single device 10.

While the foregoing process is useful for large micrometer-scale devices, it would be difficult, if not impossible, to implement for small micrometer- and sub-micrometer-scale devices. In accordance with the present invention, a photoresistless process is provided, which simplifies the processing, eliminates the need for photoresist definition of the top electrode (which would allow reduced mask features over a shadow mask), and eliminates the need for a top electrode to define the junction. Further, the teachings of the present invention provide process alternatives without molecular degradation and make possible other configurations, including, but not limited to, (1) multiple films, each in a discrete area, and (2) switches that operate laterally, instead of vertically.

That process is now described, with reference to FIGS. 3a–3d.

Present Invention

In addition to patterning the wires 12, 14, it is the connector species 16 itself that is patterned. The junction 18 is no longer exclusively defined by patterning a top wire and allows multiple patterns, and possibly multiple molecules, each in its own area (or stack) before deposition of the top electrode 14, if any. The process of the present invention also reduces cross-talk and capacitance to substrate.

Figure 3A:
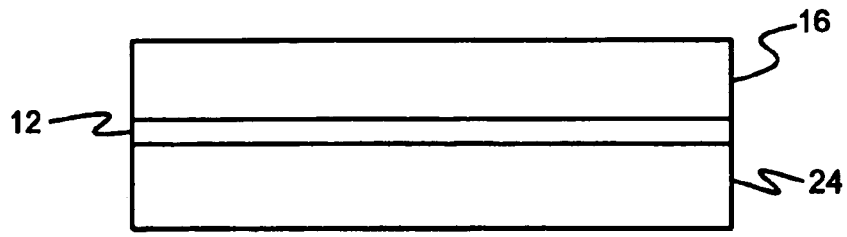
FIGS. 3a–3d depict a schematic representation of process steps in accordance with the present invention for producing photo-patternable molecular circuitry.
Figure 3B:
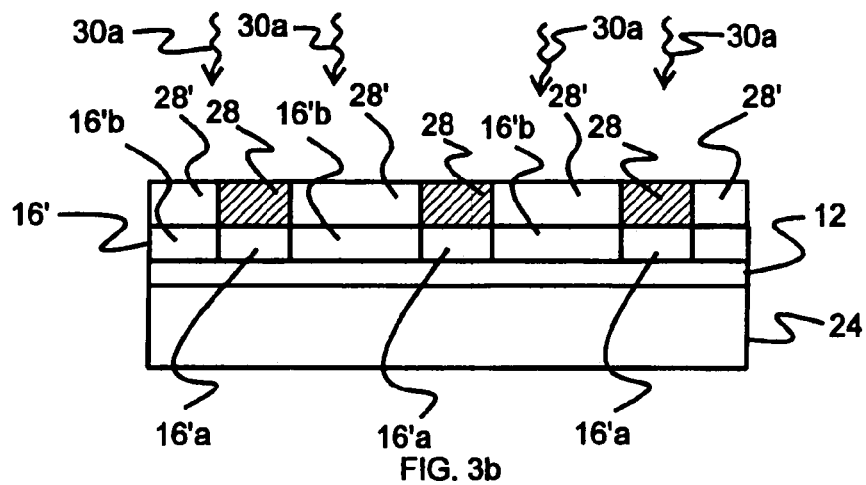
Figure 3C:
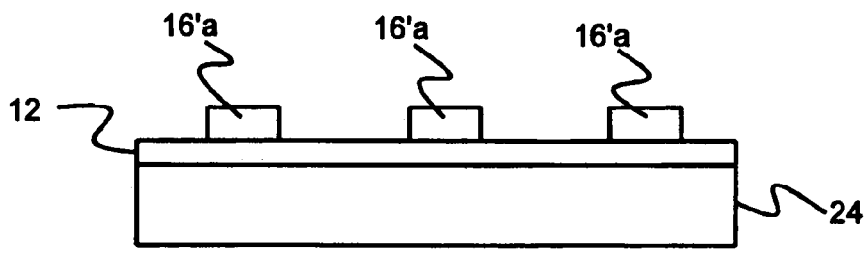
Figure 3D:
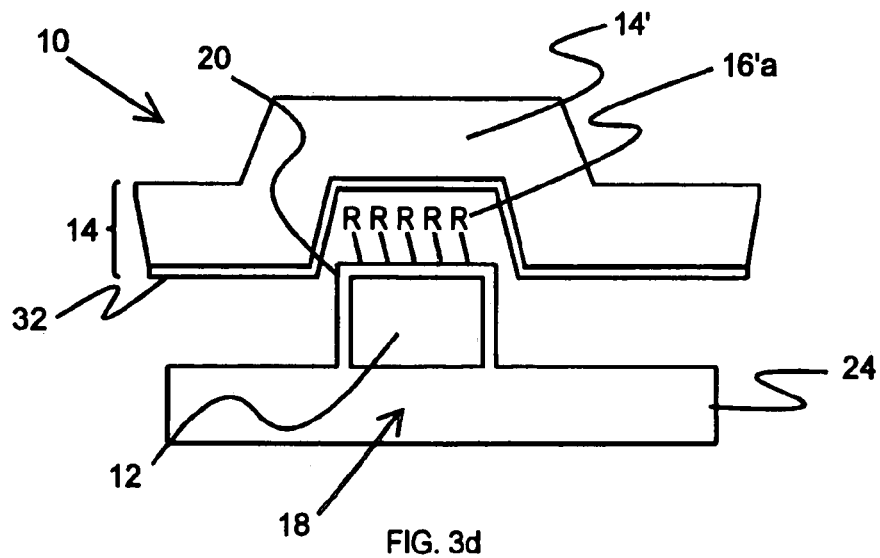

FIG. 3a depicts the formation of film 12 on a substrate 24. Film 12 forms the bottom layer of wires. FIG. 3a also depicts the deposition of a layer of the connector species 16' over the entire surface of the wire film 12. In FIG. 3b, a patterned mask 28 is placed on top of the connector species, and portions of the connector species 16' are exposed by UV light 30a, which passes through transparent regions 28' in the mask 28 to form a predetermined pattern in the connector layer 16' (regions 16'a protected by portions of the mask 28, regions 16'b exposed to UV). Alternatively, electron beam direct write procedures may be employed, using electronic scanning of an e-beam to provide controlled exposure without a mask. Prior to deposition, the connector species 16' is modified, as discussed below, to incorporate one or more photosensitive functional groups. FIG. 3c depicts the resultant patterned memory following development (patterned connector species 16'a), prior to deposition of the top layer of wires 14 thereon, if any. FIG. 3d depicts the final product. It differs from FIG. 2f in that the device 10 of FIG. 3d can be three orders of magnitude smaller than that of FIG. 2f and in that the connector species 16'a is independent of the intersection 18 between wires 12 and 14.

The process depicted in FIGS. 3a–3d is similar to the conventional photoresist process, but provides a film that has a thickness measured in nanometers that is an active component in the circuit.

The key to realizing the benefits of the present invention involves the modification of a connector species 16 by adding to the connector species a photosensitive chain, resulting in modified connector species 16'. The presence of the photosensitive chain renders the connector species sensitive to UV, electron beam, X-ray, etc. irradiation in the process depicted in FIGS. 3a–3d.

Figure 4:
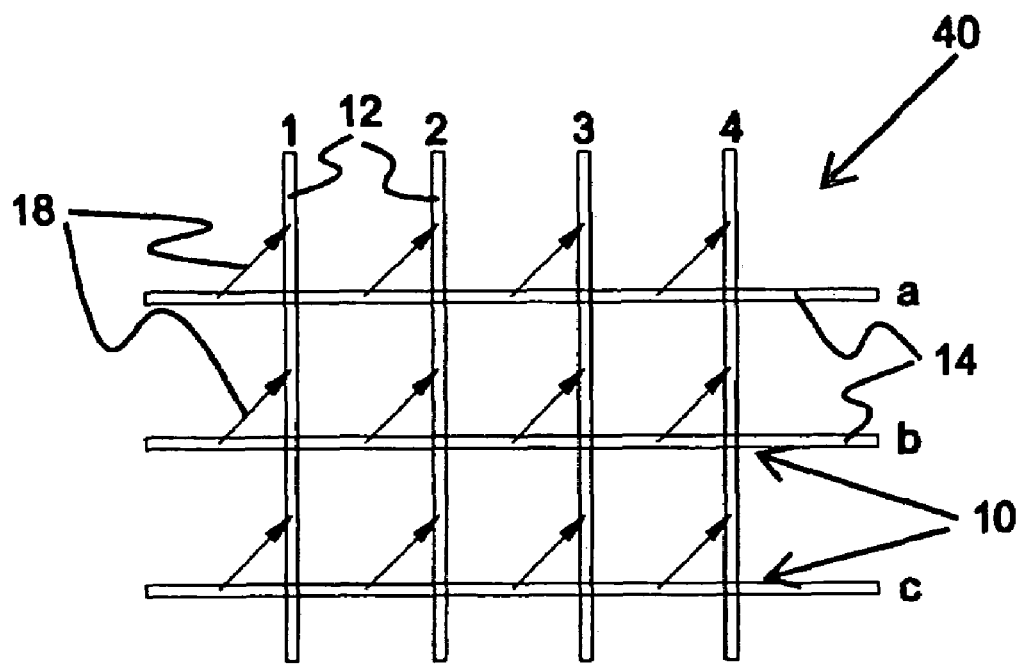
FIG. 4 is a schematic representation of a two-dimensional array of switches, depicting a 4×3 crossbar switch, wherein the switching is vertical.

FIG. 4 depicts one implementation of vertical switching, namely, a crossbar switch 40, comprising a two-dimensional array of switches 10. FIG. 4 depicts a 4×3 array 40, but the invention is not limited to the particular number of elements, or switches, 10, in the array. Access to a single point, e.g., 2b, is accomplished by applying a voltage to wires 2 and b to cause a change in the state of the molecular species 16 at the junction 18 thereof, as described above. Details of the operation of the crossbar switch array 40 are further discussed in above-referenced U.S. Pat. No. 6,128,214.

Figure 5:
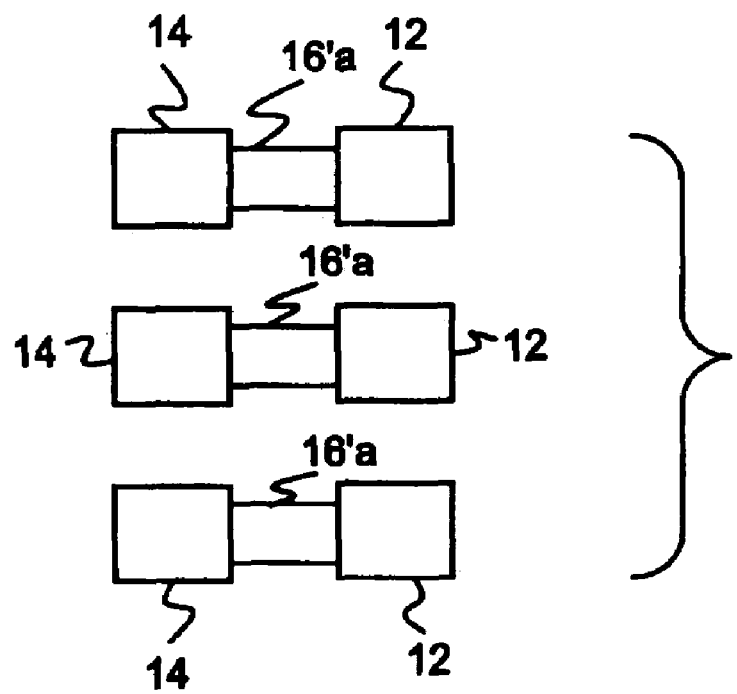
FIG. 5 is a schematic representation of an array of individual switches wherein the switching is horizontal.

FIG. 5 depicts one implementation of horizontal switching, wherein the connector species 16'a is disposed laterally between two electrodes 12 and 14.

Turning now to a discussion of the modification of the molecular species employed in the foregoing switches, the present invention provides micrometer- and nanometer-scale reversible optical and/or electronic switches that can be assembled easily to make crossbar and other circuits. The crossbar circuits have been described in the above-listed series of patent applications and issued patents. The circuits provide memory, logic and communications functions. One example of the electronic switches is the so-called crossed-wire device, described above, wherein the connector species comprises the molecular system disclosed and claimed herein.

The present invention relies on one significant property: that those photopatternable molecular switches are essentially very stable without exposure to irradiation (UV, electron beam, or X-ray, etc.), wherein the molecular system under-goes photodecomposition upon exposure to the radiation, generating decomposition products that are easily removed. Thus, one can deposit a film of such a molecular system onto a substrate of some type, such as by self-assembly, chemical deposition, vapor deposition, or Langmuir-Blodgett deposition, etc.

The key to realizing the benefits of the present invention involves the modification of a connector and/or spacer species of the molecular system by adding to the connector and/or spacer species of the molecule, a photosensitive group (PSG).

This photosensitive group disrupts the molecular system upon irradiation, creating the decomposition products. The attachment of a photosensitive group is preferably at one or both end(s) of the molecular structure, near the point of the attachment to the substrate. In addition, more PSG groups can be introduced into one or more spacer species of the molecular system. The modified molecular system with at least one PSG built-in is either chemically bonded to the substrate (e.g., electrode, another molecular system, etc.) or via van der Waals' epitaxy. It is physically and/or chemically stable to certain solvent(s) and cannot be simply removed by washing without being exposed to irradiation (UV, electron beam, or X-ray, etc.). But the PSG(s) of the molecular system undergo(es) a photochemical transformation or decomposition upon irradiation. The photo-chemically-transformed molecular system becomes very physically unstable and/or very soluble to certain solvent(s) (e.g., aqueous acid, aqueous base, alcoholic solvent(s), etc.) and can be easily removed by simple washing or extraction, etc.

The following requirements must be met in the modified molecular systems of the present invention:

(a) The molecular system must be physically and/or chemically stable without being exposed to irradiation (UV, electron beam, or X-ray, etc.);

(b) The molecular system must be physically and/or chemically unstable upon irradiation and can be easily removed by a simple one time (or more times) solvent(s) extraction or washing;

(c) The photosensitive group (PSG) can be introduced either on a side-arm (e.g., connecting and/or spacing unit(s), etc.) or on the main body as part of the molecular switching system (e.g., azo, etc.);

(d) The photosensitive group introduced into the side-arm (e.g., connecting and/or spacing units) should not interfere with or alter the electronic and/or optical properties of the molecular switching system; ideally, it (or they) should be at least one —$CH_2$— unit away from the main switching body;

(e) The photosensitive group can undergo either photochemical decomposition or photochemical transformation, or a combination of both;

(f) When the PSG is being introduced into a side-arm of the molecular system, it must be a chemically-bonded connecting unit between the main switching body and the attaching unit; it severs the molecular main body (actual switching unit) from the attaching unit by photochemical decomposition;

(g) When the PSG is being introduced into a side-arm of the molecular system, it can undergo photochemical transformation to change some physical and/or chemical properties of the molecules, and make the transformed molecule become either acidic, or basic, or more soluble in certain solvent(s) systems (preferably, aqueous base, aqueous acid, alcohol or other common organic solvent(s) systems);

(h) When the PSG severs the molecular main body (actual switching unit) from the attaching unit by photochemical decomposition, the remaining part of the attaching unit on the substrate should not have any significant electrical and/or optical properties to interfere with the functioning of the molecular circuitry. The attaching unit can be, but is not limited to, any one of following: S, O, B, N, P, Se, hydrocarbon, or substituted hydrocarbon; and (i) The PSG unit can be, but is not limited to, any one of following: photosensitive azo, photosensitive ester or ether, photosensitive amide or imide, photosensitive amine or imine, photosensitive carbonate or carbamate, photosensitive thio-ether or thio-ester, photosensitive isocyanides, photosensitive hetero-ring system with at least one of hetero-atom (e.g., N, O, S, B, P, etc.).

Following are some examples of PSG-modified molecular switching systems. Examples 1, 2 and 3 below show three different ways of constructing PSGs into the molecular switching system and how the PSG works upon irradiation. This design allows different type of molecular films and electrodes to be used, depending on the desired results.

Figure 6:
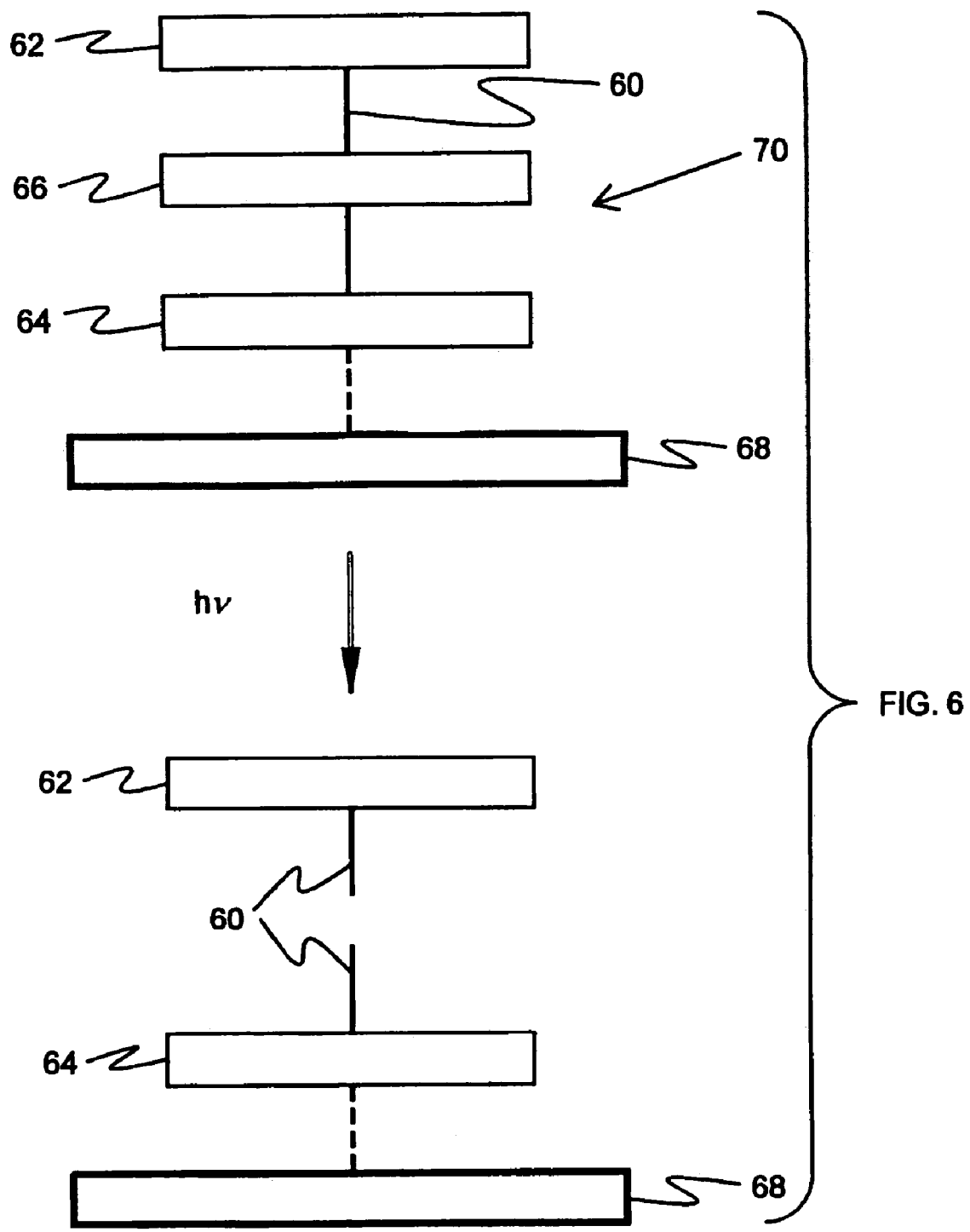
FIG. 6 is a schematic representation of one generic embodiment of the present invention, illustrating the breaking of a chemical bond between a main molecular switching unit and an attaching group due to photochemical decomposition.

Turning first to Example 1a, shown in FIG. 6, a first generic molecular example is depicted for the present invention. Example 1b, which follows, depicts a specific molecular system.

FIG. 6 is a schematic representation of one generic embodiment of the present invention, illustrating the breaking of a chemical bond 60 between a main molecular switching unit 62 and an attaching group 64 due to photochemical decomposition. A photosensitive group 66 is initially interposed between the main molecular switching unit 62 and the attaching group 64, which in turn is used to attach the main molecular switching unit to an electrode, or other substrate, 68. With the presence of the photosensitive group, the main molecular switching unit 62 is fully bonded and cannot be physically removed via extraction or washing. However, exposure of the molecule 70 to electromagnetic radiation hv is sufficient to cause photochemical decomposition, thereby breaking the bond 60 between the main molecular switching unit 62 and the attaching group 64. Consequently, the main molecular switching unit can now be easily removed via extraction or washing. The attaching group 64 does not interfere with the device.

In Example 1a, the attaching group 64 may be one of the following: carboxylic acid or its derivatives, sulfuric acid or its derivatives, phosphoric acid or its derivatives, hetero atoms (e.g., N, O, S, B, Se, P), or functional groups with at least one of above-mentioned hetero atoms, hydrocarbons or substituted hydrocarbons. The photosensitive group (PSG) 66 can be, but not limited to, any one of following: photosensitive azo, photosensitive ester or ether, photosensitive amide or imide, photosensitive amine or imine, photosensitive carbonate or carbamate, photosensitive thio-ether or thio-ester, photosensitive isocyanides, photosensitive hetero-ring system with at least one of hetero-atom (e.g., N, O, S, B, P, etc.).

Without being exposed to irradiation, the molecular switching system 70 is fully chemical bonded to the substrate (electrode, etc.) 68 through the PSG 66 and attaching group 64. It is stable and cannot be physically removed by solvent extraction or washing. Once being exposed to irradiation (UV, electron beam, X-ray, etc.), the bonding between the substrate 68 and the main body of the system has been broken due to a photochemical decomposition. The main body of the switching system (molecular system) can be removed easily from the surface of the substrate 68 by solvent extraction or washing.

Example 1b below is a real molecular example of one embodiment of the present invention, which relies on a rotor portion combined with a stator portion. In Example 1b, the rotation axis of the rotor is designed to be in a 30 to 70 degree angle to the net current-carrying axis of the molecules.

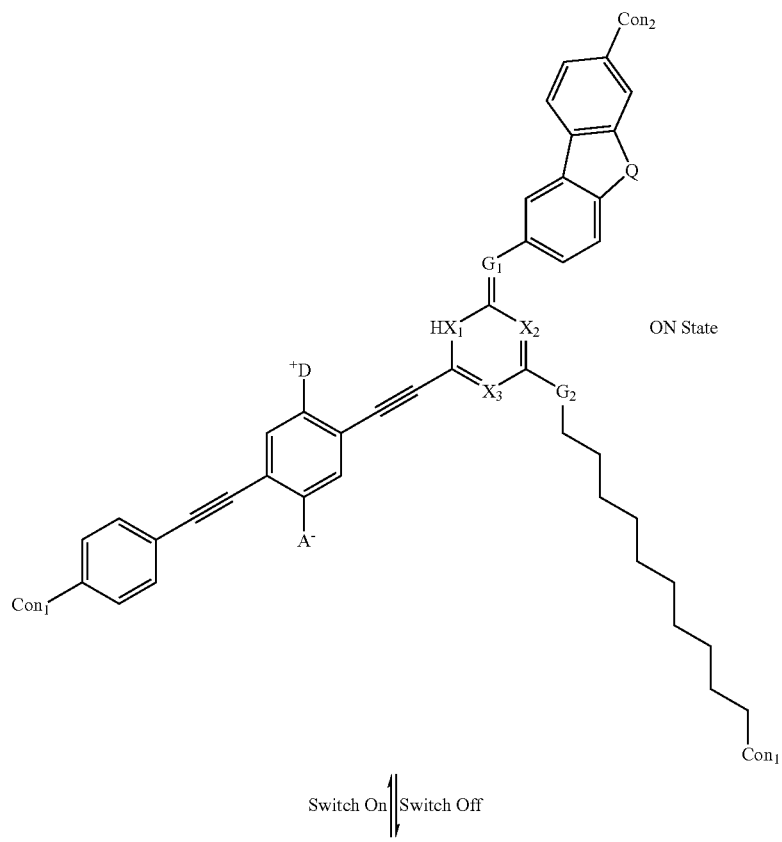
ON State
Switch On ⇌ Switch Off
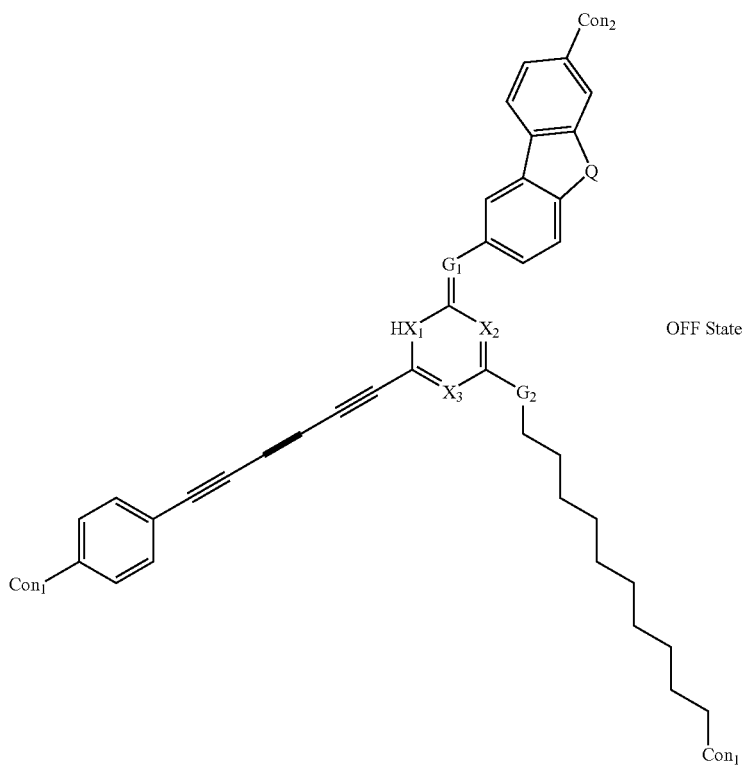
OFF State
Example 1b

Example 1b where:

The symbol A⁻ is an Acceptor group; it is an electron-withdrawing group. It may be one of following: carboxylic acid or its derivatives, sulfuric acid or its derivatives, phosphoric acid or its derivatives, nitro, nitrile, hetero atoms (e.g., N, O, S, P, F, Cl, Br), functional group with at least one of above-mentioned hetero atoms (e.g., OH, SH, NH, etc.), hydrocarbons (either saturated or unsaturated), or substituted hydrocarbons.

The symbol D⁺ represents a Donor group; it is an electron-donating group. It may be one of following: hydrogen, amine, OH, SH, ether, hydrocarbon (either saturated or unsaturated), substituted hydrocarbon, or a functional group with at least one of hetero atom (e.g., B, Si, I, N, O, S, P). The donor is differentiated from the acceptor by that fact that it is less electronegative, or more electropositive, than the acceptor group on the molecule.

The designations $Con_1$ and $Con_2$ represent connecting units between one molecule and another molecule or between a molecule and the substrate. They contain both a PSG unit and an attaching unit.

The PSG unit can be, but is not limited to, any one of following: photosensitive azo, photosensitive ester or ether, photosensitive amide or imide, photosensitive amine or imine, photosensitive carbonate or carbamate, photosensitive thio-ether or thio-ester, photosensitive isocyanides, photosensitive hetero-ring system with at least one of heteroatom (e.g., N, O, S, B, P etc.).

The attaching unit may be one of the following: carboxylic acid or its derivatives, sulfuric acid or its derivatives, phosphoric acid or its derivatives, hetero atoms (e.g., N, O, S, B, Se, P), or functional groups with at least one of above-mentioned hetero atoms, hydrocarbons or substituted hydrocarbons.

The symbols $X_1$, $X_2$, and $X_3$ represent tuning units built into the ring system. The function of these units is to tune the molecule's electronic and/or optical properties as well as to ensure that the ring system undergoes a smooth and desired tautomerization transition under the influence of an applied external E-field. The tuning units may be any one of the following: hetero atom (e.g., N, P, As, etc.), hydrocarbon, or substituted hydrocarbon.

The symbols $G_1$ and $G_2$ are bridging groups. The function of these bridging groups is to connect the stator and rotor or to connect two or more fragments to achieve desired molecular properties. They may be any one of the following: hetero atoms (e.g., N, O, S, P, etc.) or functional groups with at least one of above-mentioned hetero atoms (e.g., NH or NHNH, etc.), hydrocarbons (either saturated or unsaturated) or substituted hydrocarbons. The bridging group may alternately comprise a single atom bridge such as an ether bridge with an oxygen atom, or a direct sigma bond between the rotor and stator.

The letter Q is used here to designate a connecting unit between two phenyl rings. It can be any one of following: S. O, NH, NR, hydrocarbon, or substituted hydrocarbon.

The letter H is used here to designate a hydrogen atom.

In Example 1b above, the horizontal dotted lines represent other molecules or substrates (which can be either an electrode or non-electrode, depending on the specific application) to which the molecule is optionally linked, or connected. The direction of the switching field is perpendicular to the horizontal dotted lines. Alternatively, the attaching unit) may be eliminated, and the molecule may be simply placed between the two electrodes. The molecule shown above (Example 1b) has been designed with the internal rotor in a 30 to 70 degree angle to the orientation axis of the entire molecule. In this case, the external field is applied along the orientation axis of the molecule as pictured—the electrodes (horizontal dotted lines) are oriented perpendicular to the plane of the paper and in a 30 to 70 degree angle to the orientation axis of the molecule. Application of an electric field oriented from top to bottom in the diagrams will cause the rotor as pictured in the upper diagram to rotate to the position shown on the lower diagram, and vice versa. In this case, the rotor as pictured in the lower diagram is not coplanar with the rest of the molecule, so this is the "OFF state" of the molecule, whereas the rotor is essentially coplanar with the rest of the molecule on the upper diagram, so this is the "ON state" of the molecule.

The molecule depicted in Example 1b in its less conjugated state ("OFF") is less conductive, and/or chromatically transparent (or blue-shifted in its π-system "localized state"). In its more conjugated state ("ON"), the molecule evidences higher electrical conductivity, and/or color (or is red-shifted).

For the molecules of Example 1b, a single monolayer molecular film is formed, for example, using Langmuir-Blodgett techniques or self-assembled monolayers, such that the orientation axis of the molecules is perpendicular to the plane of the electrodes used to switch the molecules. Electrodes may be deposited in the manner described by Collier et al, supra, or methods described in the above-referenced patent applications and patents. Alternate thicker film deposition techniques include vapor phase deposition, contact or ink-jet printing, spin coating, roll coating and silk screening.

The following requirements must be met in this rotor/stator model:

(a) The molecule must have at least one rotor and one stator segment;

(b) In one state of the molecule, there should be a delocalized π-system and/or non-bonding electron(s) that extend over the large portion of the molecule (rotor(s) and stator(s)), whereas in the other state, the p-system or π- and non-bonding electron(s) are localized on the rotor(s) and stator(s);

(c) The connecting unit between rotor and stator can be a single σ-bond or at least one atom with (1) non-bonding electrons (p or other electrons), or (2) π-electrons, or (3) π-electrons and non-bonding electron(s) to connect the rotor and stator with the σ-bond;

(d) The non-bonding electrons, or π-electrons, or π-electrons and non-bonding electron(s) of the rotor(s) and stator(s) can be localized or delocalized depending on the conformation of the molecule while the rotor rotates when activated by an E-field;

(e) The conformation(s) of the molecule can be E-field dependent or bistable;

(f) The bistable state(s) can be achieved by intra- or inter-molecular forces such as hydrogen bonding, Coulomb force, van der Waals force, metal ion complex or dipole inter-stabilization; and (g) The band gap of the molecule will change depending on the degree of non-bonding electron, or n-electron, or π-electron and non-bonding electron de-localization of the molecule. This will change the conductivity of the molecule.

Example 1c below shows a real molecular example of another embodiment of the present invention. In Example 1c, the device contains two photosensitive connecting groups. Upon irradiation, e.g., UV, the connecting groups decompose to form thiol and 2-nitrophenylacetic acid, which is removable by washing with a base.

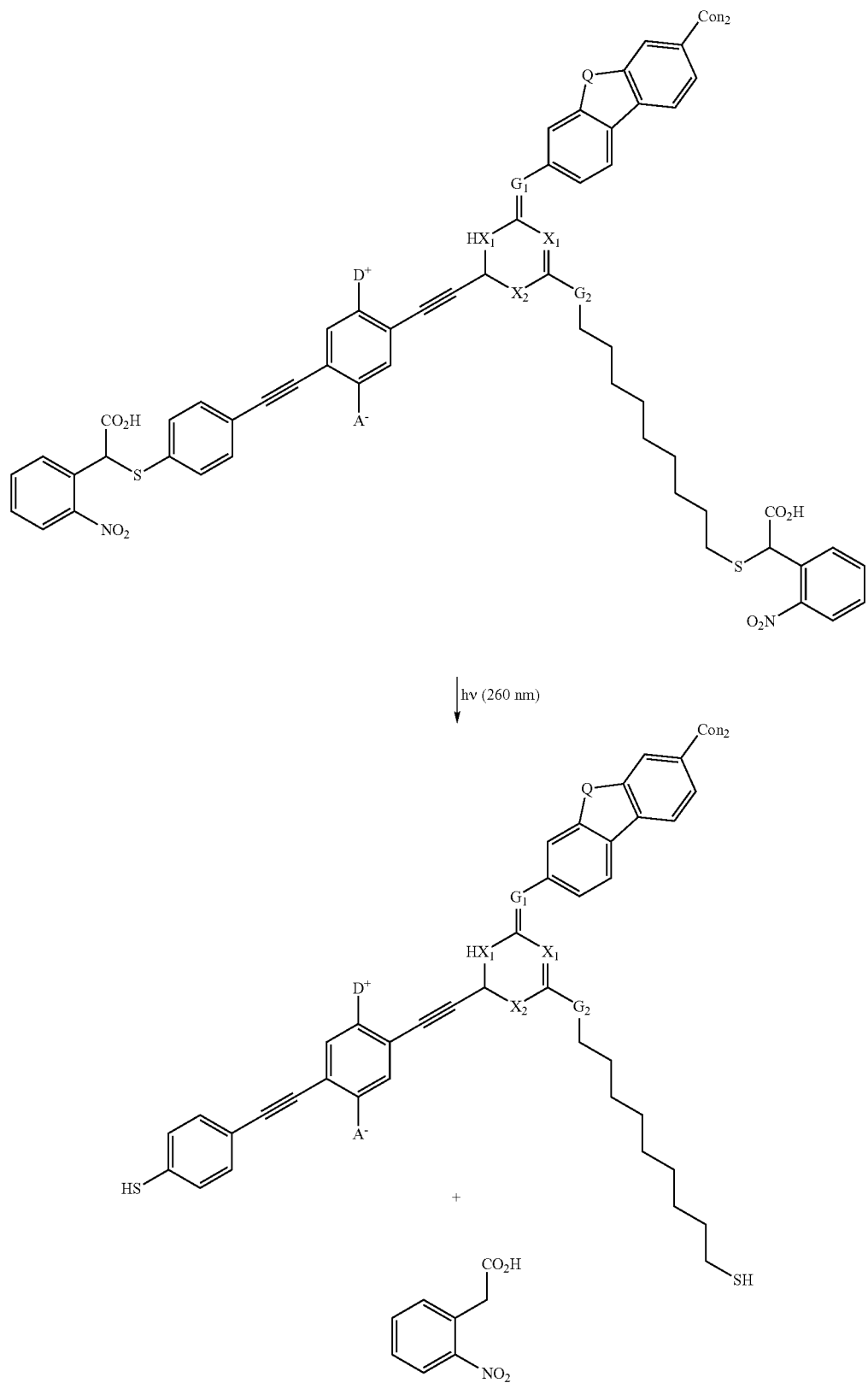
Example 1c

Example 1c where:

The symbol A⁻ is an Acceptor group; it is an electron-withdrawing group. It may be one of following: carboxylic acid or its derivatives, sulfuric acid or its derivatives, phosphoric acid or its derivatives, nitro, nitrile, hetero atoms (e.g., N, O, S, P, F, Cl, Br), functional group with at least one of above-mentioned hetero atoms (e.g., OH, SH, NH, etc.), hydrocarbons (either saturated or unsaturated), or substituted hydrocarbons.

The symbol D⁺ represents a Donor group; it is an electron-donating group. It may be one of following: hydrogen, amine, OH, SH, ether, hydrocarbon (either saturated or unsaturated), substituted hydrocarbon, or a functional group with at least one hetero atom (e.g., B, Si, I, N, O, S, P). The donor is differentiated from the acceptor by that fact that it is less electronegative, or more electropositive, than the acceptor group on the molecule.

The designation $Con_2$ represents optional connecting units between one molecule and another molecule or between a molecule and the substrate. They contain both a PSG unit and an attaching unit. Alternatively, the attaching unit may be eliminated, and the molecule may be simply placed between the two electrodes.

Symbols $X_1$, $X_2$, and $X_3$ represent tuning units built into the ring system. The function of these units is to tune the molecule's electronic and/or optical properties as well as to ensure that the ring system undergoes a smooth and desired tautomerization transition under the influence of an applied external E-field. They may be any one of the following: hetero atom (e.g., N, P, As, etc.), hydrocarbons, or substituted hydrocarbons.

Symbols $G_1$ and $G_2$ are bridging groups. The function of these bridging groups is to connect the stator and rotor or to connect two or more fragments to achieve desired molecular properties. They may be any one of the following: hetero atoms (e.g., N, O, S, P, etc.) or functional groups with at least one of above-mentioned hetero atoms (e.g., NH or NHNH, etc.), hydrocarbons (either saturated or unsaturated) or substituted hydrocarbons. The bridging group may alternately comprise a single atom bridge such as an ether bridge with an oxygen atom, or a direct sigma bond between the rotor and stator.

The letter Q is used here to designate a connecting unit between two phenyl rings. It can be any one of following: S, O, NH, NR, hydrocarbon, or substituted hydrocarbon.

The letter H is used here to designate a hydrogen atom.

Turning now to Example 2a, this depicts a second embodiment of the PSG-modified bistable molecular mechanical device of the present invention.

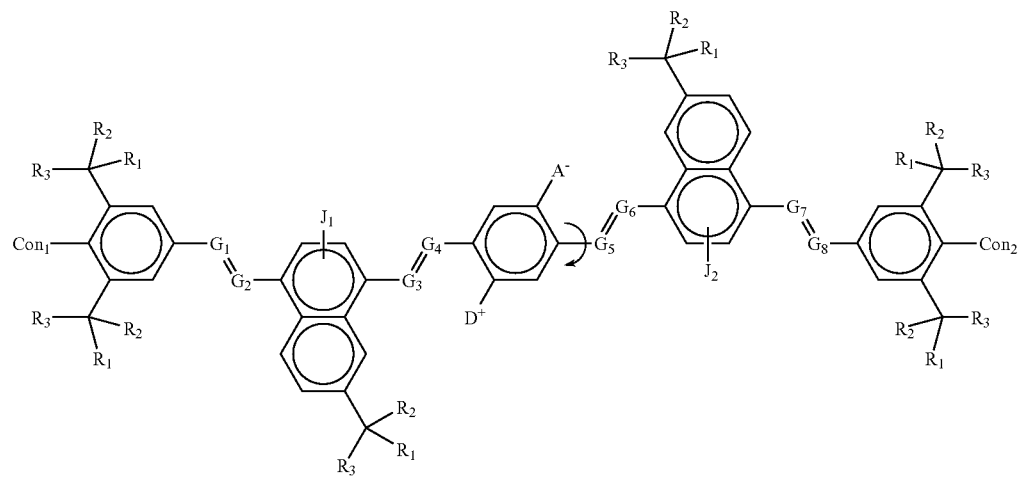

On State (More Conductive State)

Switch On | Switch Off

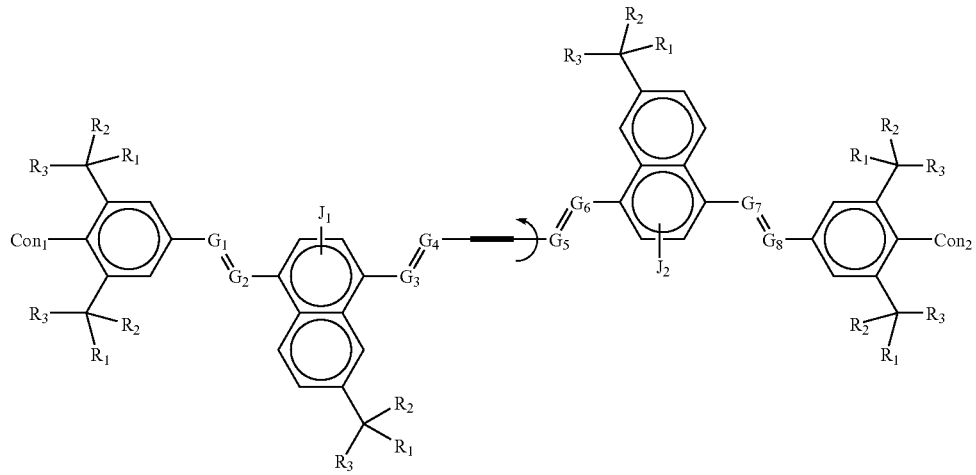

Off State (Less Conductive State)

Example 2a

Example 2a where:

The symbol A⁻ is an Acceptor group; it is an electron-withdrawing group. It may be one of following: hydrogen, carboxylic acid or its derivatives, sulfuric acid or its derivatives, phosphoric acid and its derivatives, nitro, nitrile, hetero atoms (e.g., N, O, S, P, F, Cl, Br), or a functional group with at least one of above-mentioned hetero atoms (e.g., OH, SH, NH, etc.), or hydrocarbon (either saturated or unsaturated) or substituted hydrocarbon.

The symbol D⁺ represents a Donor group; it is an electron-donating group. It may be one of following: hydrogen, amine, OH, SH, ether, hydrocarbon (either saturated or unsaturated), substituted hydrocarbon, or a functional group with at least one hetero atom (e.g., B, Si, I, N, O, S, P). The donor is differentiated from the acceptor by that fact that it is less electronegative, or more electropositive, than the acceptor group on the molecule.

The items; $G_1=G_2$, $G_3=G_4$, $G_5=G_6$, and $G_7=G_8$ are bridging groups. The function of these bridging groups is to connect the stator and rotor or to connect two or more conjugated rings to achieve a desired electronic property. They may be a PSG unit or not. They may be double bonded groups with any one or a combination of the following: hetero atoms (e.g., C, N, O, S, P, etc.) or a functional group with at least one of the above-mentioned hetero atoms (e.g., NH or NHNH, etc.), hydrocarbons (either saturated or unsaturated) or substituted hydrocarbons. The bridging group may alternately comprise a single atom bridge such as an ether bridge with an oxygen atom, or a direct sigma bond between the rotor and stator.

The designations $Con_1$ and $Con_2$ represent optional connecting units between one molecule and another molecule or between a molecule and the substrate. They contain both a PSG unit and an attaching unit. Alternatively, the attaching unit may be eliminated, and the molecule may be simply placed between the two electrodes. The PSG unit can be, but is not limited to, any one of following: photosensitive azo, photosensitive ester or ether, photosensitive amide or imide, photosensitive amine or imine, photosensitive carbonate or carbamate, photosensitive thio-ether or thio-ester, photosensitive isocyanides, or photosensitive hetero-ring system with at least one hetero atom (e.g., N, O, S, B, P etc.).

The attaching unit may be one of the following: carboxylic acid or its derivatives, sulfuric acid or its derivatives, phosphoric acid or its derivatives, hetero atoms (e.g., N, O, S, B, Se, P), or functional groups with at least one of above-mentioned hetero atoms, hydrocarbons, or substituted hydrocarbons The symbols $R_1$, $R_2$, and $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated), or substituted hydrocarbon.

The symbols $J_1$ and $J_2$ represent tuning groups built into the molecule. The function of these tuning groups (e.g., OH, NHR, COOH, CN, nitro, etc.) is to provide an appropriate functional effect (e.g. both inductive effect and resonance effects) and/or steric effect(s). The functional effect is to tune the band gap ($\Delta E_{HOMO/LUMO}$) of the molecule to obtain the desired electronic properties of the molecule ($\Delta E_{HOMO/LUMO}$=0.5 to 2.5 eV). The steric effect is to tune the molecular conformation through steric hindrance, inter- or intra-molecular interaction forces (e.g., hydrogen bonding, Coulomb interaction, van der Waals forces) or to provide bi- or multiple-stability of molecular orientations. They may be any one of the following: hydrogen, hetero atoms (e.g., N, O, S, P, B, F, Cl, Br, and I), functional groups with at least one of above-mentioned hetero atoms, or hydrocarbons (either saturated or unsaturated).

When the double-bonded groups $G_1=G_2$, $G_3=G_4$, $G_5=G_6$, and $G_7=G_8$ photosensitive bridging groups, they can undergo photochemical decomposition upon irradiation to break the main body of the molecular switching system into several small pieces, and consequently, the molecular system will be removed easily from the substrate by a simple solvent extraction or washing.

Example 2b below shows a real example of a PSG-modified switchable molecule, which contains PSGs on both the connecting units and the bridging groups Upon UV irradiation, both connecting groups and bridging groups decompose to form small molecules, which are removable by base and/or solvent washing.

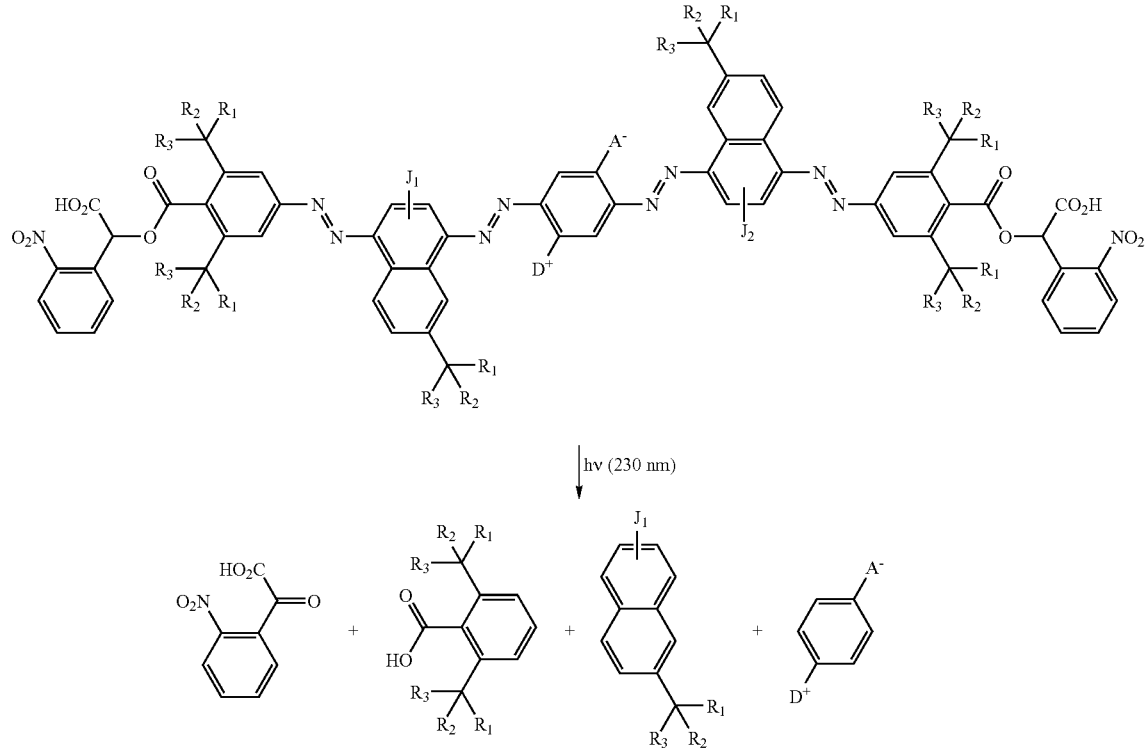

Example 2b

Example 2b where:

The symbol A⁻ is an Acceptor group; it is an electron-withdrawing group. It may be one of following: hydrogen, carboxylic acid or its derivatives, sulfuric acid or its derivatives, phosphoric acid and its derivatives, nitro, nitrile, hetero atoms (e.g., N, O, S, P, F, Cl, Br), or a functional group with at least one of above-mentioned hetero atoms (e.g., OH, SH, NH, etc.), hydrocarbon (either saturated or unsaturated), or substituted hydro-carbon.

The symbol D⁺ represents a Donor group; it is an electron-donating group. It may be one of following: hydrogen, amine, OH, SH, ether, hydrocarbon (either saturated or unsaturated), substituted hydrocarbon, or a functional group with at least one hetero atom (e.g., B, Si, I, N, O, S, P). The donor is differentiated from the acceptor by that fact that it is less electronegative, or more electropositive, than the acceptor group on the molecule.

The symbols $R_1$, $R_2$, and $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

The symbols $J_1$ and $J_2$ represent tuning groups built into the molecule. The function of these tuning groups (e.g., OH, NHR, COOH, CN, nitro, etc.) is to provide an appropriate functional effect (e.g. both inductive effect and resonance effects) and/or steric effects. The functional effect is to tune the band gap ($\Delta E_{HOMO/LUMO}$) of the molecule to obtain the desired electronic properties of the molecule. The steric effect is to tune the molecular conformation through steric hindrance, inter- or intra-molecular interaction forces (e.g. hydrogen bonding, Coulomb interaction, van der Waals forces) or to provide bi- or multiple-stability of molecular orientations. They may be any one of the following: hydrogen, hetero atoms (e.g., N, O, S, P, B, F, Cl, Br, and I), functional groups with at least one of above-mentioned hetero atoms, hydrocarbons (either saturated or unsaturated).

Figure 7:
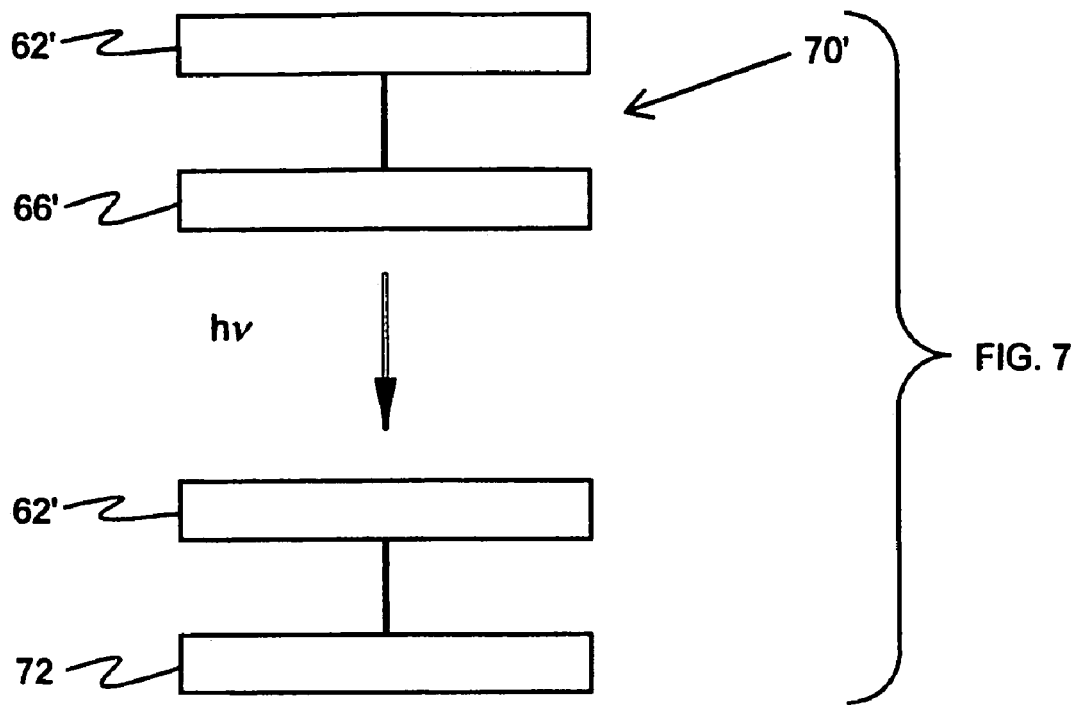
FIG. 7 is a schematic representation of another generic embodiment of the present invention, illustrating the transformation of a main molecular switching group from insolvable to solvable in solvents due to photochemical transformation.
Figure 8:
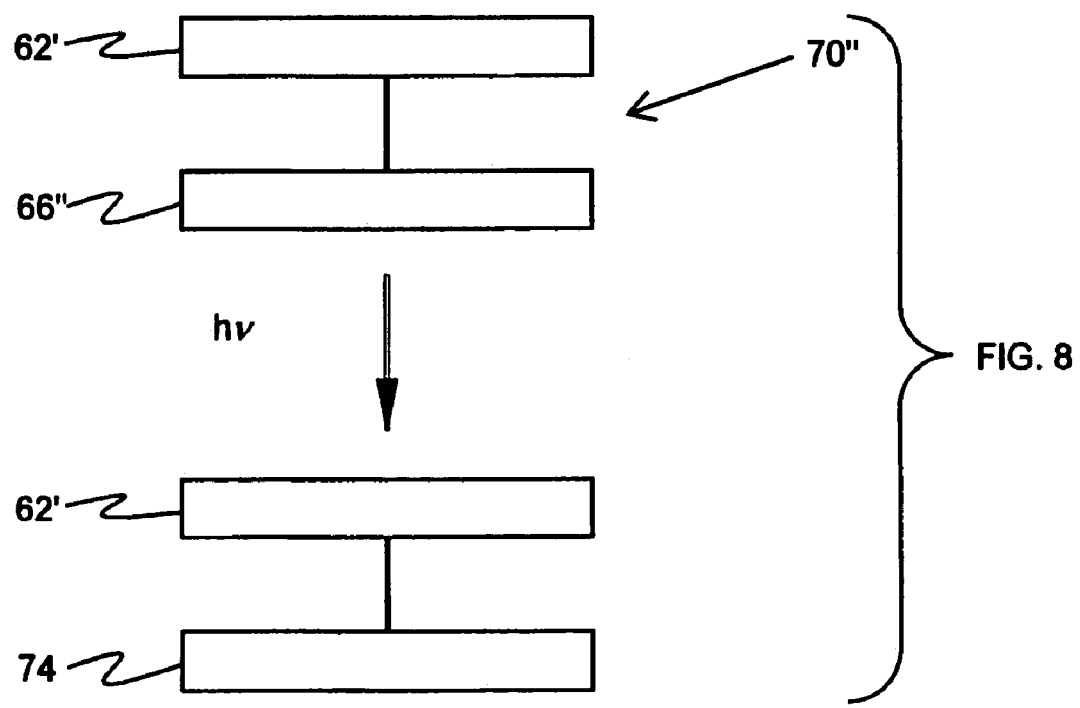
FIG. 8 is a schematic representation of yet another generic embodiment of the present invention, illustrating the transformation of a main molecular switching group from solvable to insolvable in solvents due to photochemical transformation.

Turning now to Example 3, this depicts a third embodiment of the PSG modified bistable molecular mechanical device of the present invention. Example 3a, shown in FIG. 7, depicts another generic molecular example for the present invention. In this example, the main molecular switching unit 62', which is bonded to one or more solvent-insoluble PSGs 66' to form molecule 70', cannot be physically removed via extraction or washing. However, exposure to electromagnetic radiation hv causes a photochemical transformation that converts the solvent-insoluble PSGs 66' into solvent-soluble functional groups 72, and the main molecular switching unit 62' can now be easily removed via extraction or washing.

Example 3b depicts a specific molecular system:

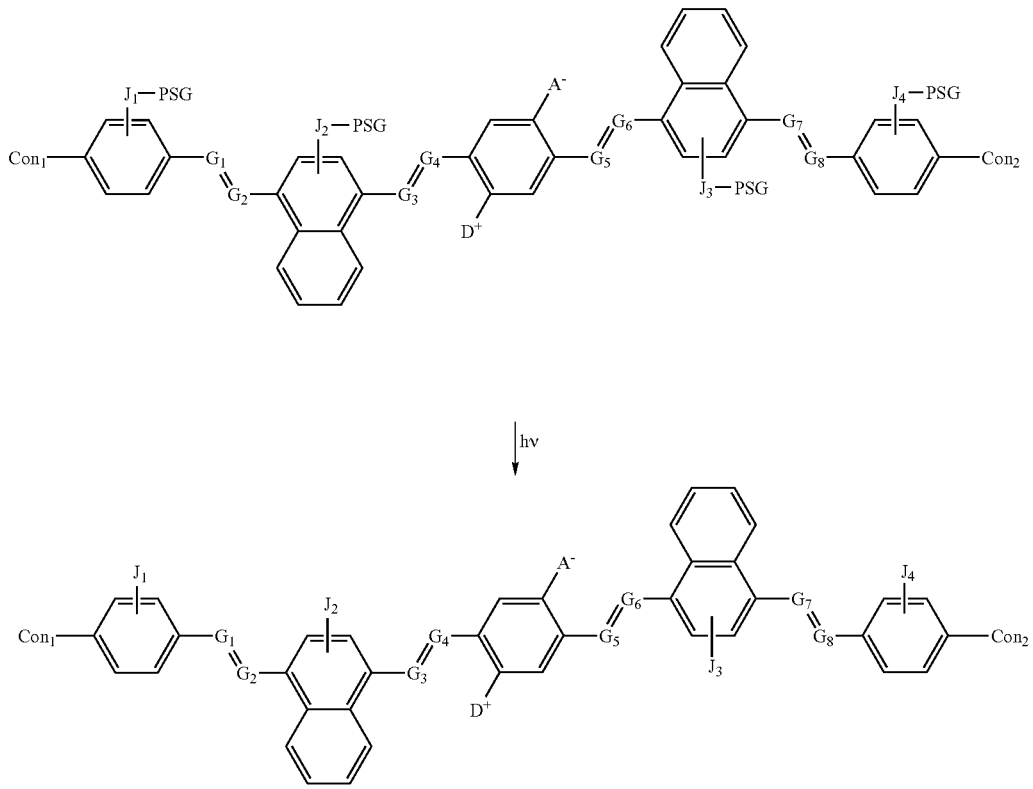

Example 3b where:

The symbol A⁻ is an Acceptor group; it is an electron-withdrawing group. It may be one of following: hydrogen, carboxylic acid or its derivatives, sulfuric acid or its derivatives, phosphoric acid and its derivatives, nitro, nitrile, hetero atoms (e.g., N, O, S, P, F, Cl, Br), a functional group with at least one of above-mentioned hetero atoms (e.g., OH, SH, NH, etc.), hydrocarbon (either saturated or unsaturated), or substituted hydrocarbon.

The symbol D⁺ represents a Donor group; it is an electron-donating group. It may be one of following: hydrogen, amine, OH, SH, ether, hydrocarbon (either saturated or unsaturated), substituted hydrocarbon, or functional group with at least one hetero atom (e.g., B, Si, I, N, O, S, P). The donor is differentiated from the acceptor by that fact that it is less electronegative, or more electropositive, than the acceptor group on the molecule.

The items labeled $G_1=G_2$, $G_3=G_4$, $G_5=G_6$, and $G_7=G_8$ are bridging groups. The function of these bridging groups is to connect the stator and rotor or to connect two or more conjugated rings to achieve a desired electronic property. They may be PSG units or not. They may be double-bonded groups with any one or a combination of the following: hetero atoms (e.g., C, N, O, S, P, etc.) or a functional group with at least one of the above-mentioned hetero atoms (e.g., NH or NHNH, etc.), hydrocarbons (either saturated or unsaturated) or substituted hydrocarbons. The bridging group may alternately comprise a single atom bridge such as an ether bridge with an oxygen atom, or a direct sigma bond between the rotor and stator.

The designations $Con_1$ and $Con_2$ represent optional connecting units between one molecule and another molecule or between a molecule and the substrate. They contain both a PSG unit and an attaching unit. Alternatively, the attaching unit may be eliminated, and the molecule may be simply placed between the two electrodes.

The symbols $J_1$, $J_2$, $J_3$, and $J_4$ represent tuning groups built into the molecule, which contains water-soluble and/or solvent-soluble functional groups (e.g., OH, NHR, COOH, CN, etc.). The designations $J_1$-PSG, $J_2$-PSG, $J_3$-PSG, and $J_4$-PSG represent the linkage of the tuning groups with PSGs, which could be ether, ester, carbonate, or carbonate linkages. Upon irradiation, e.g., UV, these linkages decompose to liberate water-soluble and/or solvent-soluble tuning groups, which are removable by water and/or solvent.

The PSG unit can be, but is not limited to, any one of following: photosensitive azo, photosensitive ester or ether, photosensitive amide or imide, photosensitive amine or imine, photosensitive carbonate or carbamate, photosensitive thio-ether or thio-ester, photosensitive isocyanides, photosensitive hetero-ring system with at least one hetero-atom (e.g. N, O, S, B, P etc.).

The attaching unit may be one of the following: carboxylic acid or its derivatives, sulfuric acid or its derivatives, phosphoric acid or its derivatives, hetero atoms (e.g., N, O, S, B, Se, P), or functional groups with at least one of above-mentioned hetero atoms, hydrocarbons or substituted hydrocarbons.

The commonly-known PSGs are listed in Table I below:

TABLE I

Photosensitive Groups and UV Wavelength of Sensitivity.

| Photosensitive Group | UV Wavelength |
|---|---|
| α-carboxy-2-nitrobenzyl (CNB) | 260 nm |
| 1-(2-nitrophenyl)ethyl (NPE) | 260 nm |
| 4,5-dimethoxy-2-nitrobenzyl (DMNB) | 355 nm |
| 1-(4,5-dimethoxy-2-nitrophenyl)ethyl (DMNPE) | 355 nm |
| (4,5-dimethoxy-2-nitrobenzyloxy)carbonyl (NVOC) | 355 nm |
| 5-carboxymethoxy-2-nitrobenzyl (CMNB) | 320 nm |
| [(5-carboxymethoxy-2-nitrobenzyl)oxy]carbonyl (CMNCBZ) | 320 nm |
| desoxybenzoinyl (desyl) | 360 nm |
| anthraquinon-2-ylmethoxycarbonyl (AQMOC) | 350 nm |

Any of the preceding PSGs may be employed in any of the preceding examples.

In the above examples, the method of patterning the film through photonic molecular change is accomplished by a destructive effect, which is similar to the manner in which positive photoresist acts (i.e., irradiated photoresist undergoes a chemical change to break bonds and allow its removal in an appropriate solvent, whereas the unirradiated areas are substantially unaffected by that same solvent).

Additionally, there is another manner by which molecular photopatterning could occur through irradiation, namely, a constructive change (see Examples 4a and 4b, below). In constructive change, a molecule with appropriate photosensitive links would be altered by irradiation so that molecules in the areas irradiated would not be removed from the substrate by the same solvent/base as the unexposed molecular region. The change could be an alteration of structural molecular form or the removal of specific sensitive groups after the breaking of a bond or bonds by irradiation.

Turning now to Example 4, this example depicts a fourth embodiment of the PSG modified bistable molecular mechanical device of the present invention. Example 4a depicts another generic molecular example for the present invention. This case is essentially the reverse of that depicted in FIG. 7. Here, the main molecular switching unit 62' has bonded thereto one or more solvent-soluble PSGs 66" to form molecule 70", which may be soluble in one or more solvents. In this case, the untransformed molecule 70" is soluble in at least one solvent, and can be physically removed via extraction or washing. However, exposure to electromagnetic radiation hv causes a photochemical transformation that converts the solvent-soluble PSGs 66" into solvent-insoluble functional groups 74, and the main molecular switching unit 62' is no longer soluble in any of the previously-used solvents, and can no longer be easily removed via extraction or washing.

Example 4b shows a real example of a PSG-modified switchable molecule, which contains PSGs on the side-arms of the molecular device. Due to the carboxylic acid groups of the PSGs on the molecule, the molecule is soluble in aqueous base(s) or solvent(s). Upon irradiation, e.g., UV, the acid groups have been transformed into —SH groups, which results in a change in the solubility of the molecule in certain solvent(s), The transformed molecule is no longer soluble in basic water or basic solvent(s). One can use this type of molecule to directly pattern the device via the photopatterning method of the present invention, and then wash or extract off those photochemically-untransformed molecules to obtain the desired molecular circuits.

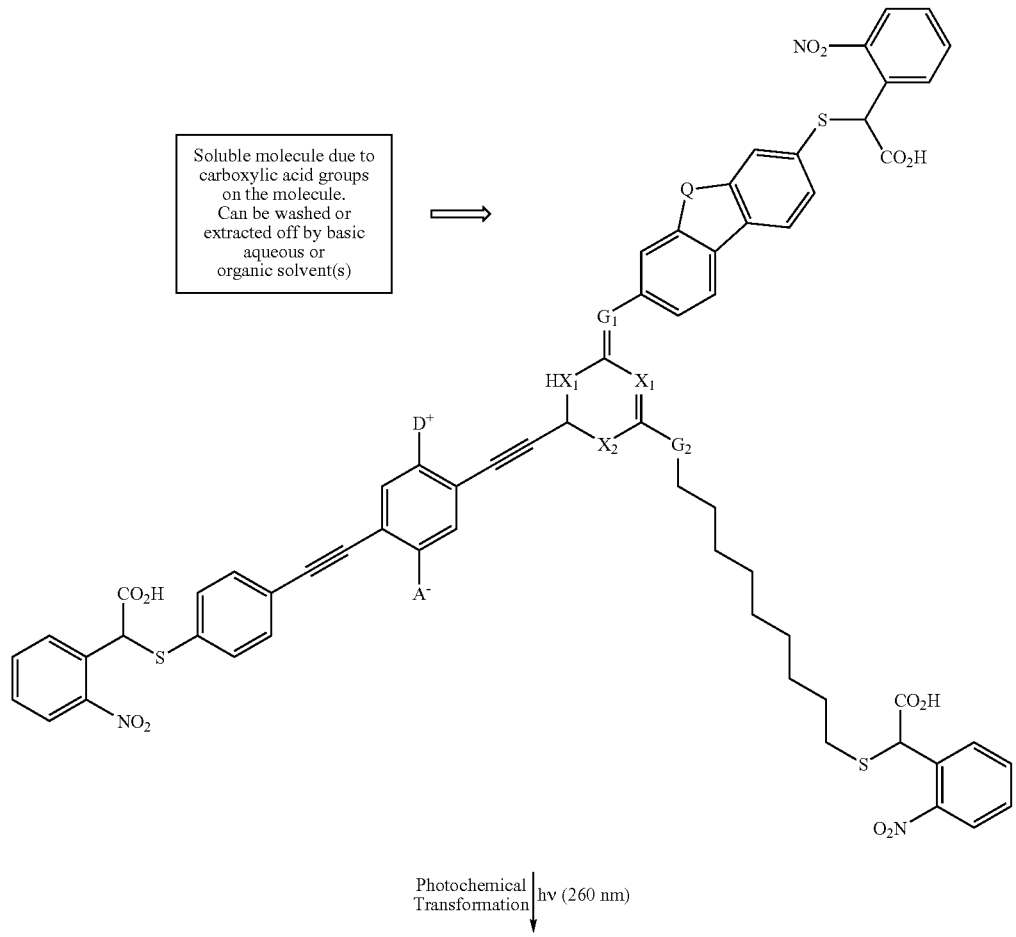

-continued

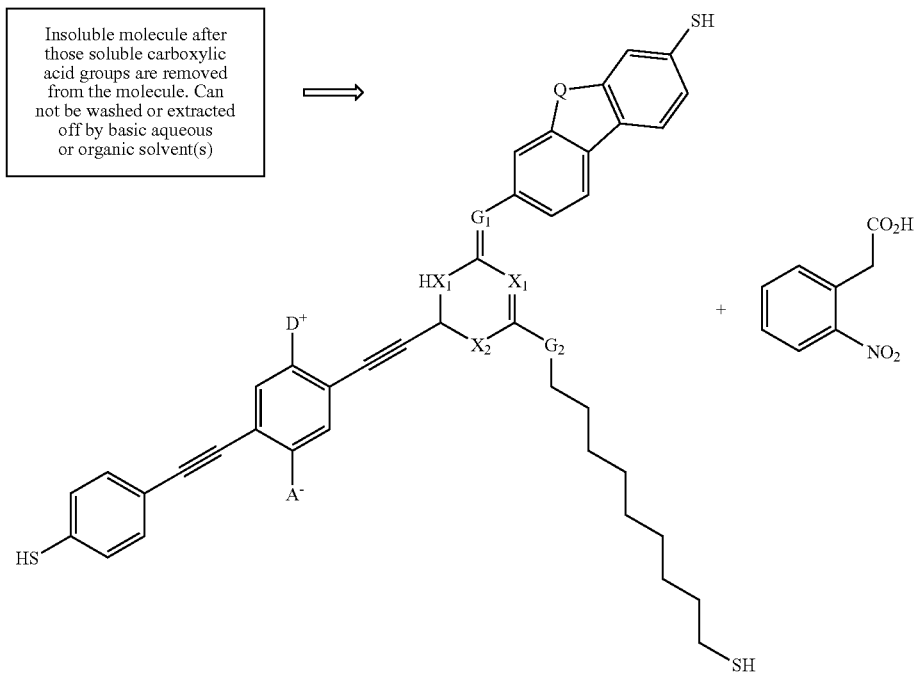

Example 4b

INDUSTRIAL APPLICABILITY

The use of a molecular photoresist as described herein is expected to find use in the fabrication of micrometer-scale and nanometer-scale devices.

What is claimed is:

1. A method for fabricating a multiple electrode device comprising at least one pair of electrodes that form at least one junction and at least one connector species connecting said pair of electrodes in said junction, said junction having a functional dimension in nanometers or micrometers, wherein said at least one connector species comprises said bistable molecule provided with at least one photosensitive functional group for patterning said connector species, said method comprising:

(a) forming a first set of said electrodes on a substrate;
 (b) depositing a film of said bistable molecule(s) including said at least one photosensitive group;
 (c) exposing portions of said bistable molecular film to desired radiation to thereby cause at least one of photochemical decomposition or photochemical transformation of said at least one photosensitive functional group; and
 (d) removing unwanted portions of said bistable molecular film to provide a photopatterned film.

2. The method of claim 1 wherein said at least one pair of electrodes comprises a positive terminal and a negative terminal and wherein said method further comprises, after step (d):

(e) depositing a second set of said electrodes adjacent said first set of said electrodes.

3. The method of claim 2 wherein said second set of electrodes is deposited above said first set of electrodes, at a non-zero angle thereto.

4. The method of claim 2 wherein said second set of electrodes is deposited in the same plane as said first set of electrodes.

5. The method of claim 2 wherein said at least one pair of electrodes comprises said first set of electrodes and at least one probe addressing tip.

6. The method of claim 1 wherein said photosensitive functional group is sensitive to ultraviolet, electron-beam, or X-ray radiation.

7. The method of claim 1 wherein said bistable molecule comprises a main chain and at least one pendant group and wherein at least one photosensitive functional group is attached either to said main chain or to said pendant group.

8. The method of claim 7 wherein one said photosensitive group is attached to at least one end of said bistable molecule.

9. The method of claim 7 wherein said photosensitive group is selected from the group consisting of α-carboxy-2-nitrobenzyl; 1-(2-nitrophenyl)ethyl; 4,5-dimethoxy-2-nitrobenzyl; 1-(4,5-dimethoxy-2-nitrophenyl)ethyl; (4,5-dimethoxy-2-nitrobenzyloxy)carbonyl; 5carboxymethoxy-2-nitrobenzyl; [(5-carboxymethoxy-2-nitrobenzyl)oxy]carbonyl; desoxybenzoinyl; and anthraquinon-2-ylmethoxycarbonyl.

10. The method of claim 1 wherein said molecule evidences switching based on electric (E) field induced band gap change, selected from the group consisting of:

(1) an E-field induced rotation of at least one rotatable section (rotor) of a molecule to change the band gap of the molecule (rotor/stator configuration);

(2) E-field-induced charge separation or recombination of the molecule via chemical bonding change to alter the band gap:

(2a) E-field-induced band gap change caused by the change of extended conjugation via charge separation or recombination accompanied by increasing or decreasing π- and/or p-electron localization;

(2b) E-field-induced band gap change caused by a change of extended conjugation via charge separation or recombination and π-bond breaking or formation; and (3) E-field-induced band gap change via molecular folding or stretching.

11. The method of claim 10 wherein said bistable molecule comprises:

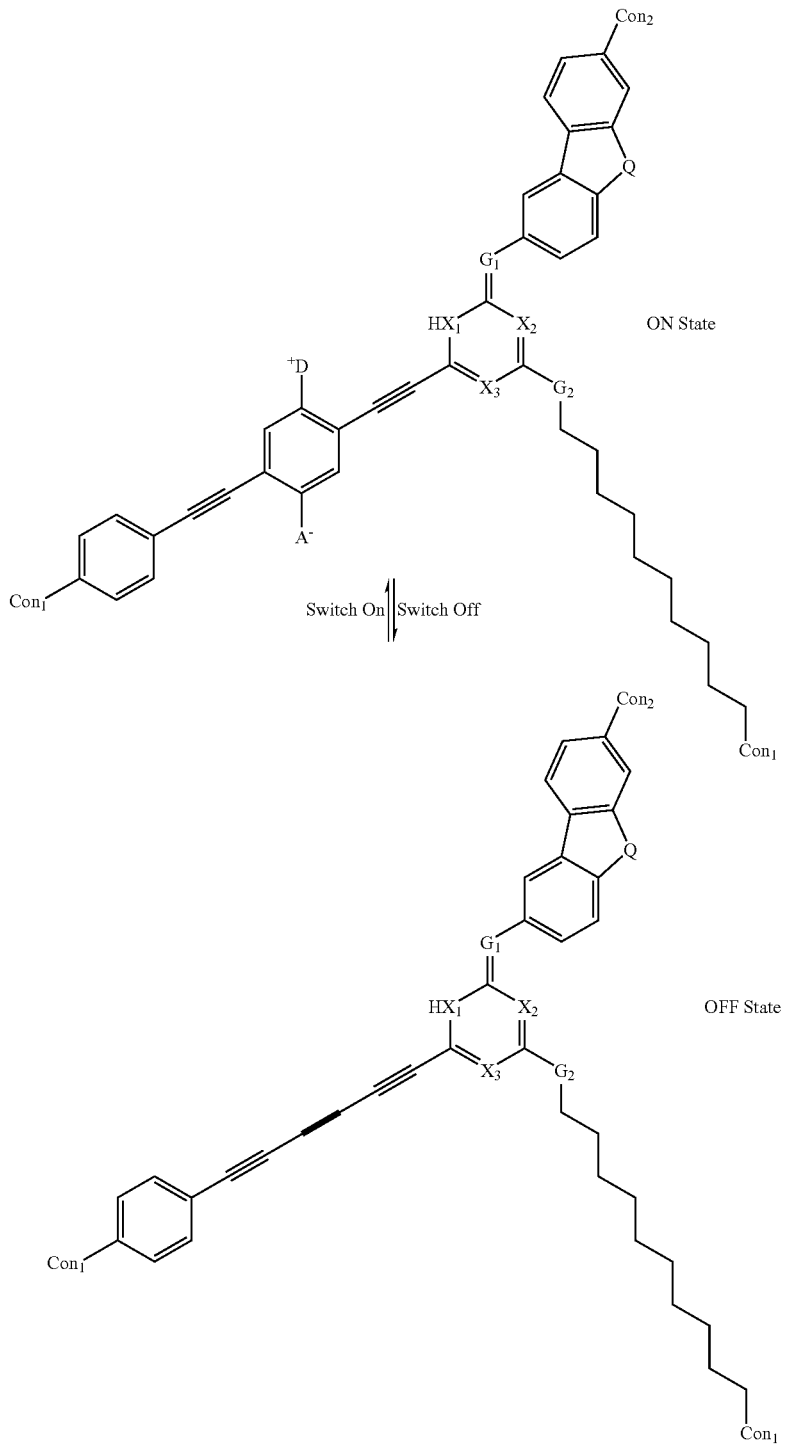

Example 1b where:

A⁻ is an Acceptor group comprising an electron-withdrawing group selected from the group consisting of (a) carboxylic acid and its derivatives, (b) sulfuric acid and its derivatives, (c) phosphoric acid and its derivatives, (d) nitro, (e) nitrile, (f) hetero atoms selected from the group consisting of N, O, S, P, F, Cl, and Br, (g) functional groups with at least one of said hetero atoms, (h) saturated or unsaturated hydrocarbons, and (i) substituted hydrocarbons;

D⁺ is a Donor group comprising an electron-donating group selected from the group consisting of (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P; wherein said Donor group is more electropositive than said Acceptor group;

$Con_1$ and $Con_2$ are connecting units between one molecule and another molecule or between a molecule and a substrate, said connecting units containing an attaching unit and at least one of said connecting units containing said photosensitive group, wherein said photosensitive group is selected from the group consisting of: photosensitive azo, photosensitive ester, photosensitive ether, photosensitive amide, photosensitive imide, photosensitive amine, photosensitive imine, photosensitive carbonate, photosensitive carbamate, photosensitive thio-ether, photosensitive thio-ester, photosensitive isocyanides, and photosensitive hetero-ring system(s) with at least one hetero-atom selected from the group consisting of N, O, S, B, and P and wherein the attaching unit is selected from the group consisting of carboxylic acid and its derivatives; sulfuric acid and its derivatives; phosphoric acid and its derivatives; hetero atoms selected from the group consisting of N, O, S, B, Se, and P; functional groups with at least one of said hetero atoms; hydrocarbons; and substituted hydrocarbons;

$X_1$, $X_2$, $X_3$ are tuning units built into the ring system which serve to tune the electronic properties, the optical properties, or both, of the bistable molecule as well as to that the ring system undergoes a smooth and desired tautomerization transition under the influence of an applied external E-field, wherein the tuning units are selected from the group consisting of a hetero atom selected from the group consisting of N, P, and As; hydrocarbons; and substituted hydrocarbons;

$G_1$ and $G_2$ are bridging groups for connecting stator and rotor portions of said bistable molecule or for connecting two or more fragments to achieve desired molecular properties, wherein the bridging groups are either (a) selected from the group consisting of hetero atoms selected from the group consisting of N, O, S, and P; functional groups with at least one of said hetero atoms; saturated or unsaturated hydrocarbons; and substituted hydrocarbons or (b) selected from the group consisting of a single atom bridge and a direct sigma bond between said rotor and stator portions;

Q is a connecting unit between two phenyl rings, selected from the group consisting of S, O, NH, NR, hydrocarbons, and substituted hydrocarbons; and H is a hydrogen atom.

12. The method of claim 10 wherein said bistable molecule comprises:

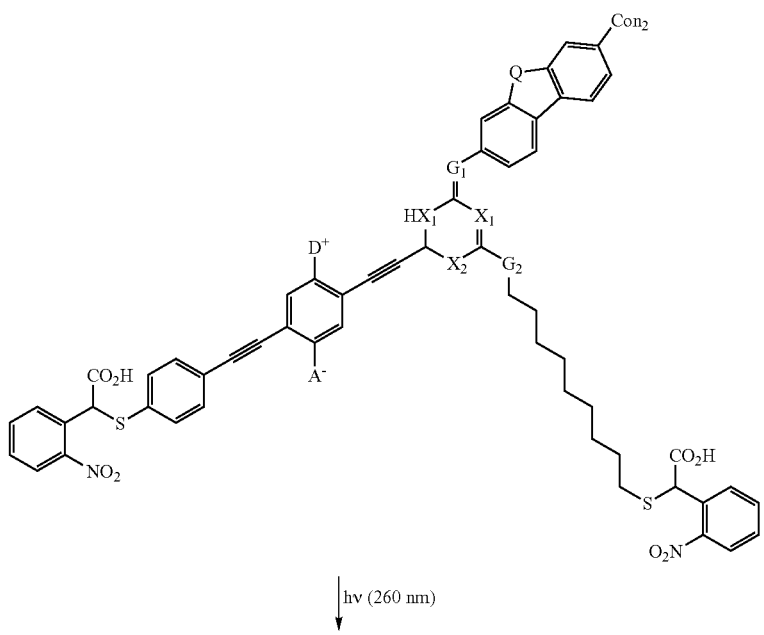

-continued

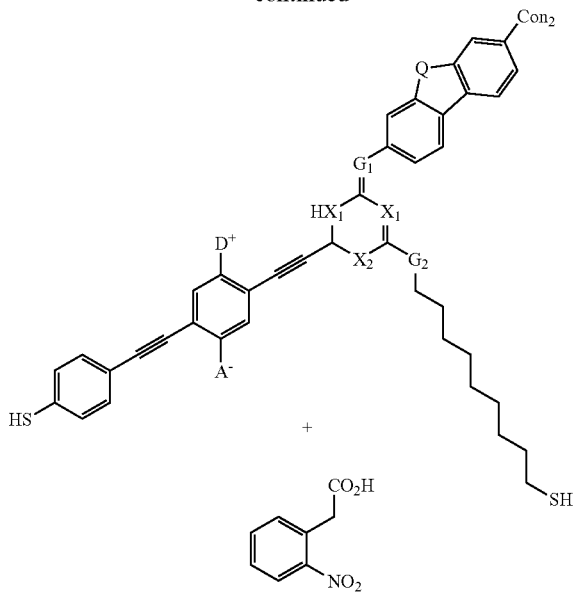

where:

A⁻ is an Acceptor group comprising an electron-withdrawing group selected from the group consisting of (a) carboxylic acid and its derivatives, (b) sulfuric acid and its derivatives, (c) phosphoric acid and its derivatives, (d) nitro, (e) nitrile, (f) hetero atoms selected from the group consisting of N, O, S, P, F, Cl, and Br, (g) functional groups with at least one of said hetero atoms, (h) saturated or unsaturated hydrocarbons, and (i) substituted hydrocarbons;

D⁺ is a Donor group comprising an electron-donating group selected from the group consisting of (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P; wherein said Donor group is more electropositive than said Acceptor group;

$Con_2$ is a connecting unit between one molecule and another molecule or between a molecule and a substrate, said connecting unit containing an attaching unit and said photosensitive group, wherein said photosensitive group is selected from the group consisting of: photosensitive azo, photosensitive ester, photosensitive ether, photosensitive amide, photosensitive imide, photosensitive amine, photosensitive imine, photosensitive carbonate, photosensitve carbamate, photosensitive thio-ether, photosensitive thio-ester, photosensitive isocyanides, and photosensitive hetero-ring system(s) with at least one hetero-atom selected from the group consisting of N, O, S, B, and P and wherein the attaching unit is selected from the group consisting of carboxylic acid and its derivatives; sulfuric acid and its derivatives; phosphoric acid and its derivatives; hetero atoms selected from the group consisting of N, O, S, B, Se, and P; functional groups with at least one of said hetero atoms; hydrocarbons; and substituted hydrocarbons;

$X_1$, $X_2$, $X_3$ are tuning units built into the ring system which serve to tune the electronic properties, the optical properties, or both, of the bistable molecule as well as to ensure that the ring system undergoes a smooth and desired tautomerization transition under the influence of an applied external E-field, wherein the tuning units are selected from the group consisting of a hetero atom selected from the group consisting of N, P, and As, hydrocarbons, and substituted hydrocarbons;

$G_1$ and $G_2$ are bridging groups for connecting stator and rotor portions of said bistable molecule or for connecting two or more fragments to achieve desired molecular properties, wherein the bridging groups are either (a) selected from the group consisting of hetero atoms selected from the group consisting of N, O, S, and P; functional groups with at least one of said hetero atoms; saturated or unsaturated hydrocarbons; and substituted hydrocarbons or (b) selected from the group consisting of a single atom bridge and a direct sigma bond between said rotor and stator portions;

Q is a connecting unit between two phenyl rings, selected from the group consisting of S, O, NH, NR, hydrocarbons, and substituted hydrocarbons; and H is a hydrogen atom.

13. The method of claim 10 wherein said bistable molecule comprises:

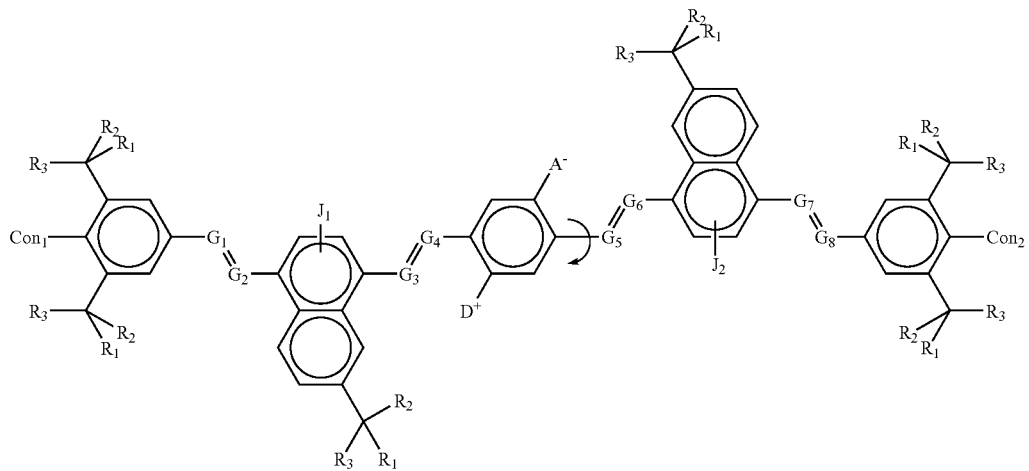
On State (More Conductive State)
Switch On ⇌ Switch Off
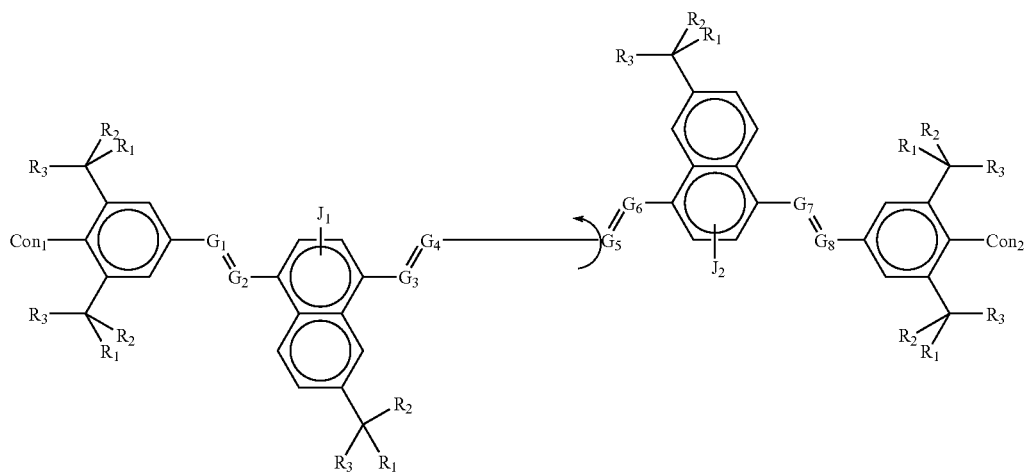
Off State (Less Conductive State)

$R_1$, $R_2$, and $R_3$ are spacing groups selected from the group consisting of (a) hydrogen, (b) saturated or unsaturated hydrocarbons, and (c) substituted hydrocarbons; and $J_1$ and $J_2$ are tuning groups to provide at least one appropriate functional effect selected from the group consisting of inductive effects, resonance effects, and steric effects; said tuning groups being selected from the group consisting of (a) hydrogen, (b) hetero atoms selected from the group consisting of N, O, S, P, B, F, Cl, Br, and I, (c) functional groups with at least one of said hetero atoms, (d) saturated or unsaturated hydrocarbons, and (e) substituted hydrocarbons.

14. The method of claim 10 wherein said bistable molecule comprises:

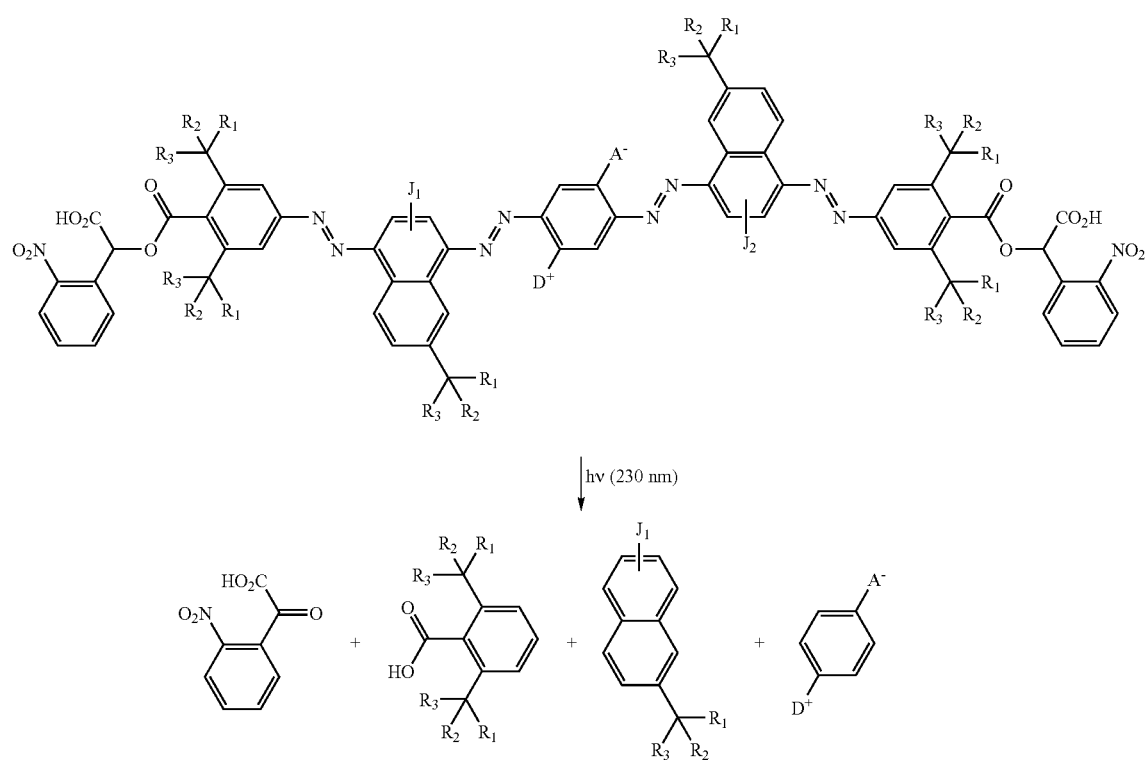

where:

$A^-$ is an Acceptor group comprising an electron-withdrawing group selected from the group consisting of (a) carboxylic acid and its derivatives, (b) sulfuric acid and its derivatives, (c) phosphoric acid and its derivatives, (d) nitro, (e) nitrile, (f) hetero atoms selected from the group consisting of N, O, S, P, F, Cl, and Br, (g) functional groups with at least one of said hetero atoms, (h) saturated or unsaturated hydrocarbons, and (i) substituted hydrocarbons;

where:

$A^-$ is an Acceptor group comprising an electron-withdrawing group selected from the group consisting of (a) carboxylic acid and its derivatives, (b) sulfuric acid and its derivatives, (c) phosphoric acid and its derivatives, (d) nitro, (e) nitrile, (f) hetero atoms selected from the group consisting of N, O, S, P, F, Cl, and Br, (g) functional groups with at least one of said hetero atoms, (h) saturated or unsaturated hydrocarbons, and (i) substituted hydrocarbons;

$D^+$ is a Donor group comprising an electron-donating group selected from the group consisting of (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P; wherein said Donor group is more electropositive than said Acceptor group;

$G_1=G_2$, $G_3=G_4$, $G_5=G_6$, and $G_7=G_8$ are bridging groups for connecting stator and rotor portions of said bistable molecule or for connecting two or more conjugated rings to achieve desired electronic properties, wherein the bridging groups are either (a) photosensitive functional groups or (b) selected from the group consisting of hetero atoms selected from the group consisting of N, O, S, and P; functional groups with at least one of said hetero atoms; saturated or unsaturated hydrocarbon;, and substituted hydrocarbons, or (c) selected from the group consisting of a single atom bridge and a direct sigma bond between said rotor and stator portions;

$Con_1$ and $Con_2$ are connecting units between one molecule and another molecule or between a molecule and a substrate, said connecting units containing an attaching unit and at least one of said connecting units containing said photosensitive group, wherein said photosensitive group is selected from the group consisting of: photosensitive azo, photosensitive ester, photosensitive ether, photosensitive amide, photosensitive imide, photosensitive amine, photosensitive imine, photosensitive carbonate, photosensitive carbamate, photosensitive thio-ether, photosensitive thio-ester, photosensitive isocyanides, and photosensitive hetero-ring system(s) with at least one hetero-atom selected from the group consisting of N, O, S, B, and P and wherein the attaching unit is selected from the group consisting of carboxylic acid and its derivatives; sulfuric acid and its derivatives; phosphoric acid and its derivatives; hetero atoms selected from the group consisting of N, O, S, B, Se, and P; functional groups with at least one of said hetero atoms; hydrocarbons; and substituted hydrocarbons;

$D^+$ is a Donor group comprising an electron-donating group selected from the group consisting of (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P; wherein said Donor group is more electropositive than said Acceptor group;

$R_1$, $R_2$, and $R_3$ are spacing groups selected from the group consisting of (a) hydrogen, (b) saturated or unsaturated hydrocarbons, and (c) substituted hydrocarbons; and $J_1$ and $J_2$ are tuning groups to provide at least one appropriate functional effect selected from the group consisting of inductive effects, resonance effects, and steric effects; said tuning groups being selected from the group consisting of (a) hydrogen, (b) hetero atoms selected from the group consisting of N, O, S, P, B, F, Cl, Br, and I, (c) functional groups with at least one of said hetero atoms, (d) saturated or unsaturated hydrocarbons, and (e) substituted hydrocarbons.

15. The method of claim 10 wherein said bistable molecule comprises:

where:
$A^-$ is an Acceptor group comprising an electron-withdrawing group selected from the group consisting of (a) carboxylic acid and its derivatives, (b) sulfuric acid and its derivatives, (c) phosphoric acid and its derivatives, (d) nitro, (e) nitrile, (f) hetero atoms selected from the group consisting of N, O, S, P, F, Cl, and Br, (g) functional groups with at least one of said hetero atoms, (h) saturated or unsaturated hydrocarbons, and (i) substituted hydrocarbons;

$D^+$ is a Donor group comprising an electron-donating group selected from the group consisting of (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P; wherein said Donor group is more electropositive than said Acceptor group;

$G_1=G_2$, $G_3=G_4$, $G_5=G_6$, and $G_7=G_8$ are bridging groups for connecting stator and rotor portions of said bistable molecule or for connecting two or more conjugated rings to achieve desired electronic properties, wherein the bridging groups are either (a) photosensitive functional groups, or (b) selected from the group consisting of hetero atoms selected from the group consisting of N, O, S, and P; functional groups with at least one of said hetero atoms; saturated or unsaturated hydrocarbons; and substituted hydrocarbons, or (c) selected from the group consisting of a single atom bridge and a direct sigma bond between said rotor and stator portions;

$Con_1$ and $Con_2$ are connecting units between one molecule and another molecule or between a molecule and

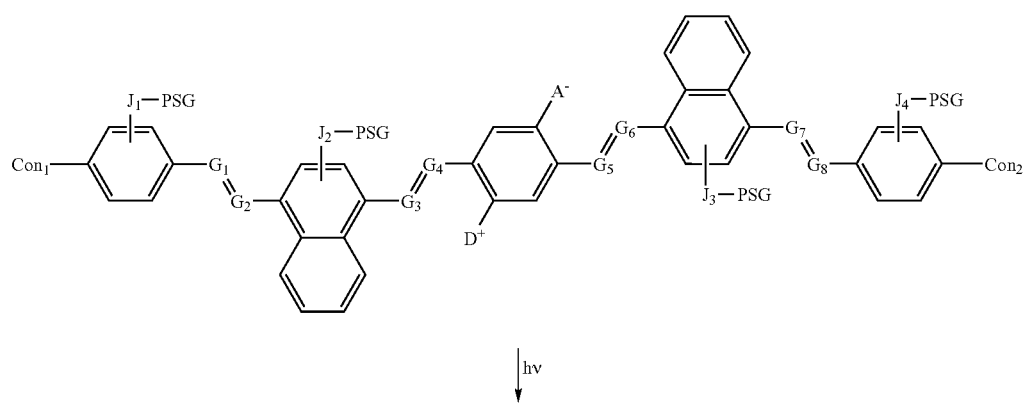

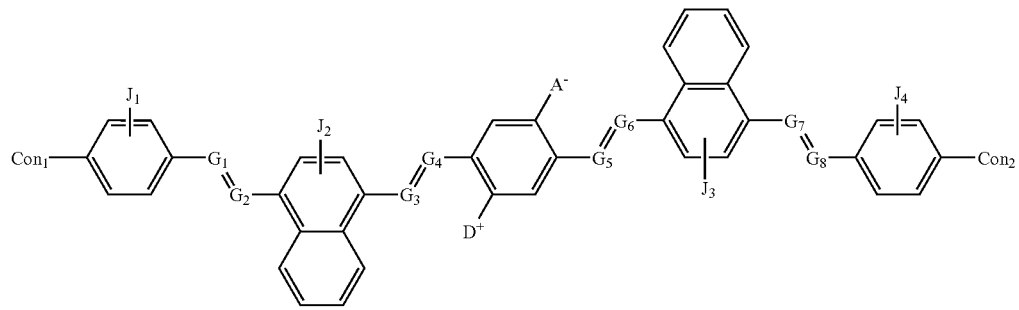

a substrate, said connecting units containing an attaching unit and at least one of said connecting units containing said photosensitive group, wherein said photosensitive group is selected from the group consisting of: photosensitive azo, photosensitive ester, photosensitive ether, photosensitive amide, photosensitive imide, photosensitive amine, photosensitive imine, photosensitive carbonate, photosensitive carbamate, photosensitive thio-ether, photosensitive thioester, photosensitive isocyanides, and photosensitive hetero-ring system(s) with at least one hetero-atom selected from the group consisting of N, O, S, B, and P and wherein the attaching unit is selected from the group consisting of carboxylic acid and its derivatives; sulfuric acid and its derivatives; phosphoric acid and its derivatives; hetero atoms selected from the group consisting of N, O, S, B, Se, and P; functional groups with at least one of said hetero atoms; hydrocarbons; and substituted hydrocarbons;

$J_1$, $J_2$, $J_3$, and $J_4$ are tuning groups which contain solvent functional groups selected from the group consisting of OH, NHR, COOH, and CN, where R is alkyl or aryl, wherein $J_1$-PSG, $J_2$-PSG, $J_3$-PSG, and $J_4$-PSG are linkages of said tuning groups with said photosensitive groups and are selected from the group consisting of ether, ester, carbonate, amide and carbamate linkages.

* * * * *